United States Patent
Won et al.

(10) Patent No.: US 11,770,964 B2
(45) Date of Patent: *Sep. 26, 2023

(54) THIN-FILM ENCAPSULATION

(71) Applicant: Applied Materials, Inc., Santa Clara, CA (US)

(72) Inventors: Tae Kyung Won, San Jose, CA (US); Soo Young Choi, Fremont, CA (US); Sanjay D. Yadav, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 83 days.

This patent is subject to a terminal disclaimer.

(21) Appl. No.: 17/212,920

(22) Filed: Mar. 25, 2021

(65) Prior Publication Data

US 2021/0210737 A1   Jul. 8, 2021

Related U.S. Application Data

(63) Continuation of application No. 16/042,807, filed on Jul. 23, 2018.

(Continued)

(51) Int. Cl.
*H01L 51/56* (2006.01)
*C23C 16/34* (2006.01)
(Continued)

(52) U.S. Cl.
CPC ........... *H10K 71/00* (2023.02); *C23C 16/345* (2013.01); *C23C 16/505* (2013.01);
(Continued)

(58) Field of Classification Search
CPC ............. H01L 51/5237; H01L 51/5253; H01L 51/5256; H10K 50/844; H10K 50/8445; H10K 50/873; H10K 50/8731
See application file for complete search history.

(56) References Cited

U.S. PATENT DOCUMENTS 6,660,659 B1   12/2003   Kraus et al.
6,872,429 B1    3/2005   Chen et al.
(Continued)

FOREIGN PATENT DOCUMENTS

CN   102714280 A     10/2012
CN   107845732 A  *   3/2018   ......... H01L 51/5256
(Continued)

OTHER PUBLICATIONS

Machine translation, Xiao, Chinese Pat. Pub. No. CN-107845733-A, translation date: Dec. 29, 2022, Espacenet, all pages. (Year: 2022).*

(Continued)

*Primary Examiner* — Victoria K. Hall
(74) *Attorney, Agent, or Firm* — Patterson + Sheridan, LLP

(57) ABSTRACT

A method of encapsulating an organic light emitting diode (OLED) is provided. The method includes generating a first plasma in a process chamber, the first plasma having an electron density of at least $10^{11}$ cm$^{-3}$ when an OLED device is positioned within the process chamber. The OLED device includes a substrate and an OLED formed on the substrate. The method further includes pretreating one or more surfaces of the OLED and substrate with the first plasma; depositing a first barrier layer comprising silicon and nitrogen over the OLED by generating a second plasma comprising silicon and nitrogen in the process chamber, the second plasma having an electron density of at least $10^{11}$ cm$^{-3}$, and depositing a buffer layer over the first barrier layer; and depositing a second barrier layer comprising silicon and nitrogen over the buffer layer by generating a third plasma comprising silicon and nitrogen in the process chamber.

20 Claims, 13 Drawing Sheets

Related U.S. Application Data

(60) Provisional application No. 62/536,559, filed on Jul. 25, 2017.

(51) Int. Cl.
    *C23C 16/505*     (2006.01)
    *H01L 51/52*     (2006.01)
    *H10K 71/00*     (2023.01)
    *H10K 50/844*     (2023.01)
    *H10K 59/124*     (2023.01)

(52) U.S. Cl.
CPC ....... H10K 50/8445 (2023.02); *H10K 50/844* (2023.02); *H10K 59/124* (2023.02)

(56) References Cited

U.S. PATENT DOCUMENTS

| | | | |
|---|---|---|---|
| 8,871,616 B2 | 10/2014 | Ahn et al. | |
| 9,331,311 B2 | 5/2016 | Chen | |
| 10,312,475 B2* | 6/2019 | Won | H01L 51/56 |
| 10,991,916 B2* | 4/2021 | Won | H01L 51/5256 |
| 2004/0212759 A1* | 10/2004 | Hayashi | H10K 50/844 |
| | | | 349/84 |
| 2005/0287688 A1 | 12/2005 | Won et al. | |
| 2007/0246163 A1 | 10/2007 | Paterson et al. | |
| 2009/0317640 A1* | 12/2009 | Takahashi | C23C 16/30 |
| | | | 428/446 |
| 2010/0253215 A1* | 10/2010 | Fukagawa | H01L 51/5234 |
| | | | 313/504 |
| 2012/0156890 A1* | 6/2012 | Yim | H01L 21/7682 |
| | | | 257/E21.241 |
| 2012/0228668 A1 | 9/2012 | Thoumazet et al. | |
| 2014/0024180 A1 | 1/2014 | Choi et al. | |
| 2014/0186544 A1* | 7/2014 | Hua | H01L 21/0217 |
| | | | 427/534 |
| 2015/0162565 A1* | 6/2015 | Ryu | H01L 51/5256 |
| | | | 257/40 |
| 2015/0194637 A1* | 7/2015 | Ishikawa | C23C 16/511 |
| | | | 118/699 |
| 2016/0254490 A1* | 9/2016 | Ryu | H01L 51/5256 |
| | | | 257/40 |
| 2017/0162826 A1* | 6/2017 | Lin | C23C 16/515 |

FOREIGN PATENT DOCUMENTS

| | | | | |
|---|---|---|---|---|
| CN | 107845733 A | * | 3/2018 | ......... H01L 51/5256 |
| JP | 2013-504863 A | | 2/2013 | |
| KR | 20120096084 A | | 8/2012 | |
| KR | 1020120096084 | | 8/2012 | |
| KR | 10-2016-0103589 A | * | 9/2016 | ....... H01L 21/02126 |
| KR | 20160103589 A | | 9/2016 | |
| WO | 2016149573 A1 | | 9/2016 | |

OTHER PUBLICATIONS

Machine translation, Xiao, Chinese Pat. Pub. No. CN-107845732-A, translation date: Dec. 29, 2022, Espacenet, all pages. (Year: 2022).*

Machine translation, Lee, Korean Pat. Pub. No. KR-2016-0103589A, translation date: Dec. 28, 2022, Espacenet, all pages. (Year: 2022).*

H. Kim et al, Thin film passivation of organic light emitting diodes by inductively coupled plasma chemical vapor deposition, 2007, Thin Solid Films, vol. 515, pp. 4758-4762. (Year: 2007).*

International Search Report dated Nov. 1, 2018 for Application No. PCT/US2018/040779.

International Preliminary Report on Patentability for International Application No. PCT/US2018/040779 dated Feb. 6, 2020, 10 pages.

Kim et al. "Thin film passivation of organic light emitting diodes by inductively coupled plasma chemical vapor deposition," 2007, Thin Solid Films 515, pp. 4758-4762.

Korean Office Action dated Nov. 30, 2020 for Application No. 10-2020-7002090.

Chinese Office Action dated Sep. 28, 2021 for Application No. 201880041661.5.

Korean Office Action dated Oct. 31, 2022 for Application No. 10-2021-7038448.

\* cited by examiner

THIN-FILM ENCAPSULATION

CROSS-REFERENCE TO RELATED APPLICATIONS

This application is a continuation of co-pending U.S. patent application Ser. No. 16/042,807, filed Jul. 23, 2018, now U.S. Pat. No. 10,991,916, issued Apr. 27, 2021, which claims benefit of U.S. provisional patent application Ser. No. 62/536,559, filed Jul. 25, 2017. Each of the aforementioned related patent applications is herein incorporated by reference.

BACKGROUND OF THE INVENTION

Field of the Invention

Embodiments described herein generally relate to a thin-film encapsulation (TFE) structure formed over a device on a substrate and a method of forming the same.

Description of the Related Art

Organic light emitting diode displays (OLED displays) have recently gained significant interest in display applications in view of their faster response times, larger viewing angles, higher contrast, lighter weight, lower power consumption and amenability to being formed on flexible substrates as compared to conventional LCD or plasma displays. In addition to organic materials used in OLED devices, many polymer materials have been developed for small molecule, flexible organic light emitting diode (FOLED) and polymer light emitting diode (PLED) displays. Many of these organic and polymer materials are suitable for the fabrication of complex, multi-layer devices on a range of substrates, making them ideal for various transparent multi-color display applications, such as thin flat panel display (FPD), electrically pumped organic laser, and organic optical amplifier.

OLED devices may have limited lifetimes, characterized by a decrease in electroluminescence efficiency and an increase in drive voltage thereof. One known reason for these degradations of OLED device performance is the formation of non-emissive dark spots or regions within an OLED display due to moisture and/or oxygen ingress into the organic layers of the OLED device. For this reason, OLED devices are typically encapsulated with a thin film including one or more moisture-transport limiting, transparent materials. The moisture and oxygen blocking properties of these thin-film encapsulants are generally directly related to the thickness of the thin-film encapsulants. Current thin-film encapsulants—including barrier layer(s) and buffer layer(s)—generally have a thickness from about 50,000 Å to about 100,000 Å to prevent the OLED device from degrading due to moisture and/or oxygen penetration during the useful life of the OLED device. Although 50,000 Å to 100,000 Å is relatively thin, these thicknesses reduce the flexibility of the OLED device and can cause cracking when the OLED device is subjected to bending, folding, rolling, or similar stresses.

Therefore, there is a need for an improved thin-film encapsulant that can perform the moisture and oxygen-blocking properties of current thin-film encapsulants without the problems described above.

SUMMARY OF THE INVENTION

Embodiments of the disclosure generally relate to improved methods for encapsulating organic light emitting diodes and related apparatuses. In one embodiment, a method of encapsulating an organic light emitting diode (OLED) is provided. The method includes generating a first plasma in a process chamber, the first plasma having an electron density of at least $10^{11}$ cm$^{-3}$, wherein an OLED device is positioned within the process chamber, the OLED device including a substrate and an OLED formed on the substrate; pretreating one or more surfaces of the OLED and substrate with the first plasma; depositing a first barrier layer comprising silicon and nitrogen over the OLED by generating a second plasma comprising silicon and nitrogen in the process chamber, the second plasma having an electron density of at least $10^{11}$ cm$^{-3}$ and the second plasma generated after the first plasma; depositing a buffer layer over the first barrier layer; and depositing a second barrier layer comprising silicon and nitrogen over the buffer layer by generating a third plasma comprising silicon and nitrogen in the process chamber, the third plasma generated after the depositing of the buffer layer.

In another embodiment, a method of encapsulating an organic light emitting diode (OLED) device is provided. The method includes generating a first plasma in a process chamber, the first plasma having a first electron density, wherein an OLED device is positioned within the process chamber, the OLED device including a substrate and an OLED formed on the substrate, pretreating one or more surfaces of the OLED and substrate with the first plasma, depositing a first barrier layer comprising silicon and nitrogen over the OLED by generating a second plasma comprising silicon and nitrogen in the process chamber, the second plasma generated after the first plasma, wherein the second plasma has a second electron density, depositing a buffer layer over the first barrier layer, and depositing a second barrier layer comprising silicon and nitrogen over the buffer layer by generating a third plasma comprising silicon and nitrogen in the process chamber, the third plasma generated after the depositing of the buffer layer, wherein the third plasma has a third electron density lower than the first electron density and the second electron density.

In another embodiment, a method of encapsulating an organic light emitting diode (OLED) device is provided. The method includes generating a first plasma in a process chamber, the first plasma having a first electron density, wherein an OLED device is positioned within the process chamber, the OLED device including a substrate and an OLED formed on the substrate, pretreating one or more surfaces of the OLED and substrate with the first plasma, depositing a first barrier layer comprising silicon and nitrogen over the OLED by generating a second plasma comprising silicon and nitrogen in the process chamber, the second plasma generated after the first plasma, wherein the second plasma has a second electron density less than the first electron density, depositing a buffer layer over the first barrier layer, and depositing a second barrier layer comprising silicon and nitrogen over the buffer layer by generating a third plasma comprising silicon and nitrogen in the process chamber, the third plasma generated after the depositing of the buffer layer, wherein the third plasma has a third electron density greater than the second electron density.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
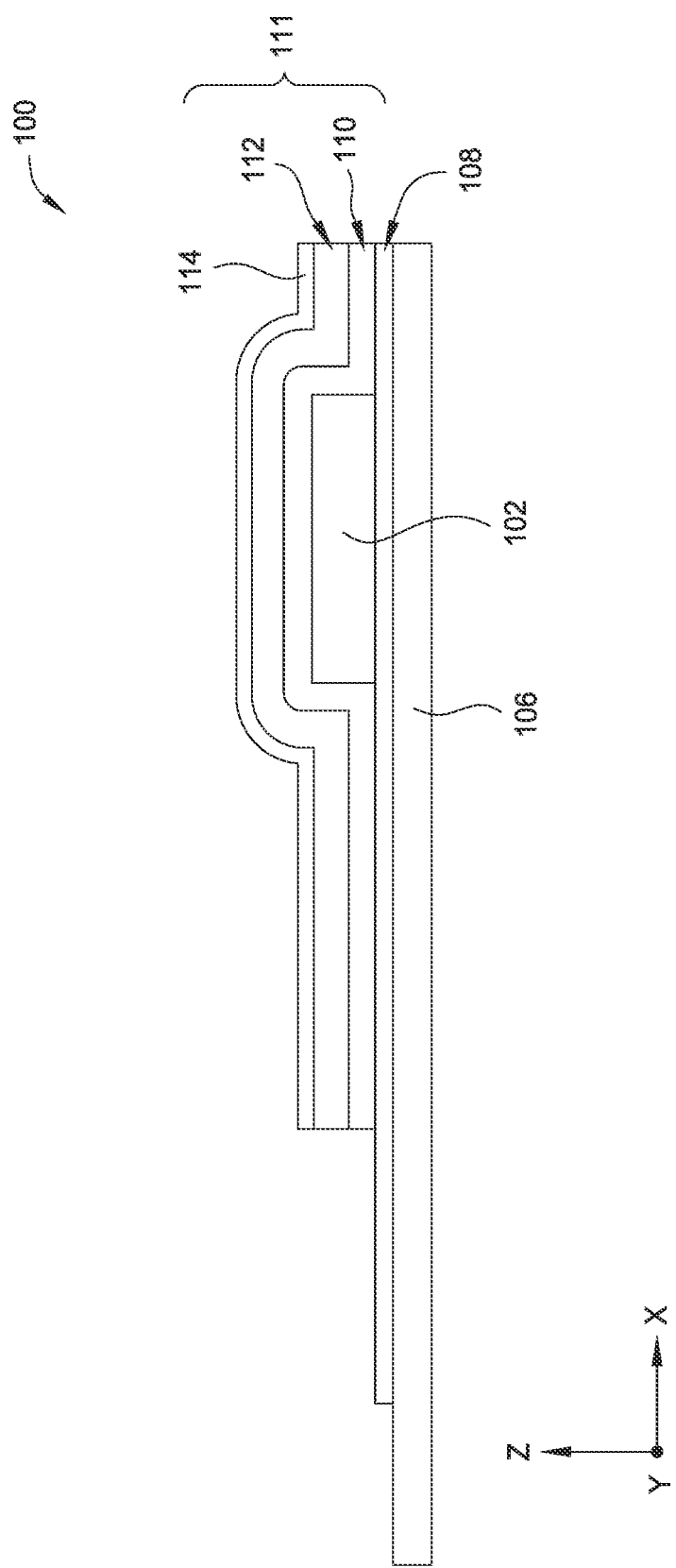
FIG. 1 is a side cross-sectional view of an OLED device including an OLED and an encapsulant layer formed over the OLED, according to embodiments described herein.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

Embodiments of the disclosure include a method and related apparatuses for forming improved encapsulants for organic light emitting diode (OLED) devices. The encapsulants described below have a reduced thickness compared to conventional OLED encapsulants while still effectively blocking moisture and oxygen migration from damaging a formed OLED device. This reduced thickness increases throughput during manufacturing while also making the OLED device more flexible and durable than OLED devices having a thicker encapsulant, or encapsulant structure.

FIG. 1 is a side cross-sectional view of an OLED device 100 including OLED 102 and an encapsulant 111 formed over the OLED 102, according to embodiments described herein. The OLED device 100 includes a substrate 106 and the OLED 102 formed over the substrate 106. The OLED 102 can be formed from a series of deposition using masks. Typically, the substrate 106 can be formed of a glass, metallic (e.g., copper or stainless steel), or polymer material. For example, in some embodiments a polymer substrate is made of a thin, flexible polymer sheet, such as a polyimide (PI), a polyethyleneterephthalate (PET) or a polyethylenenaphthalate (PEN) sheet. The OLED device 100 can further include a contact layer 108 disposed between the OLED 102 and the substrate 106. The contact layer 108 includes a transparent conductive oxide, such as indium tin oxide, indium zinc oxide, zinc oxide, or tin oxide.

The encapsulant 111 is a thin-film encapsulant (TFE) formed over the OLED 102 to protect the OLED device 100 from performance degradation resulting from exposure of the OLED 102 to moisture and/or oxygen during the normal lifetime of the formed OLED device. The encapsulant 111 can include a first barrier layer 110, a buffer layer 112, and a second barrier layer 114. In other embodiments, the encapsulant 111 can include a plurality of buffer layers and more than two barrier layers, where each buffer layer is disposed between two barrier layers, such as the buffer layer 112 disposed between barrier layers 110 and 114. In some embodiments, at least one of the barrier layers 110, 114 is formed using a high-density plasma (i.e., a plasma having an electron density of at least $10^{11}$ cm$^{-3}$) as described in more detail below. In still other embodiments, one or more of the barrier layers 110, 114 can include two or more portions, where each portion is formed from a plasma having a different density (e.g., a first portion formed using a high-density plasma with an electron density of at least $10^{11}$ cm$^{-3}$ and a second portion formed from a lower-density plasma, such as a plasma having an electron density of about $10^9$ cm$^{-3}$) as described in more detail below. The at least one portion of at least one of the barrier layers 110, 114 formed from the high-density plasma has improved moisture and oxygen blocking properties relative to a portion of similar thickness formed from a lower-density plasma.

The first barrier layer 110 can include a dielectric film, such as silicon nitride (SiN), silicon oxynitride (SiON), silicon dioxide (SiO$_2$), aluminum oxide (Al$_2$O$_3$), aluminum nitride (AlN), titanium oxide (TiO$_2$), zirconium (IV) oxide (ZrO$_2$) or combinations thereof. The buffer layer 112 can be an organic layer, such as a hexamethyldisiloxane (HMDSO) layer, for example a fluorinated plasma-polymerized HMDSO (pp-HMDSO:F) and/or a polymer material including hydrogen, carbon, and oxygen, where the polymer material has a formula C$_x$H$_y$O$_z$, wherein x, y and z are integers. In other embodiments, the buffer layer material is selected from a group consisting of polyacrylate, parylene, polyimides, polytetrafluoroethylene, copolymer of fluorinated ethylene propylene, perfluoroalkoxy copolymer resin, copolymer of ethylene and tetrafluoroethylene, parylene, and combinations thereof.

At least one of the barrier layers 110, 114 can be a barrier layer (e.g., a silicon nitride layer) deposited using a high-density plasma (i.e., a plasma having an electron density of at least $10^{11}$ cm$^{-3}$) as described in more detail below. The barrier layers 110, 114 are spaced apart in the Z-direction (first direction) above the OLED 102 (i.e., not on the sides of the OLED 102). The barrier layers which are deposited using a high-density plasma can have a thickness of from about 50 Å to about 5000 Å, such as about 100 Å to about 2500 Å in the Z-direction over the OLED 102. Barrier layers in thin-film encapsulants are generally formed using lower density plasmas (i.e., a plasma having an electron density of about $10^9$ cm$^{-3}$) using techniques, such as a capacitively coupled plasma (CCP) process. A lower density plasma formed during a CCP process is generally used to achieve desired deposited film (e.g., uniformity, stress, etc.) and plasma properties (e.g., uniformity, reduced arcing, etc.). In some embodiments, the density of the high-density plasma (e.g., electron density of about $10^{11}$ cm$^{-3}$) used to form the at least one barrier layer is at least 100 times greater than the density of the lower-density plasma (e.g., electron density of about $10^9$ cm$^{-3}$) used to form another barrier layer in the encapsulant 111.

Encapsulants (including individual barrier and buffer layers) using only barrier layers formed using conventional lower-density plasmas generally require a thickness of greater than 50,000 Å to obtain the moisture-blocking and/or oxygen-blocking properties of the barrier layer, such as a water vapor transmission rate (WVTR) of less than $1\times10^{-4}$ g/m$^2$ day. However, for example, an encapsulant using barrier layers of SiN deposited using a high-density plasma can have a WVTR of less than $1\times10^{-4}$ g/m$^2$ day with less than 25,000 Å total encapsulant thickness. Furthermore, the individual barrier layers of silicon nitride in these encapsulants can be formed from a high-density plasma and can have thicknesses from about 50 Å to about 5000 Å, such as about 100 Å to about 2500 Å resulting in a more flexible OLED device compared to barrier layers formed from lower density plasmas having a thickness of at least 5000 Å. OLED devices including these thinner barrier layers are also less prone to cracking relative to OLED devices that contain barrier layers formed with lower-density plasmas, which can improve the functionality and durability of the OLED device ultimately produced using the barrier layer(s) formed with high-density plasmas.

Figure 2A:
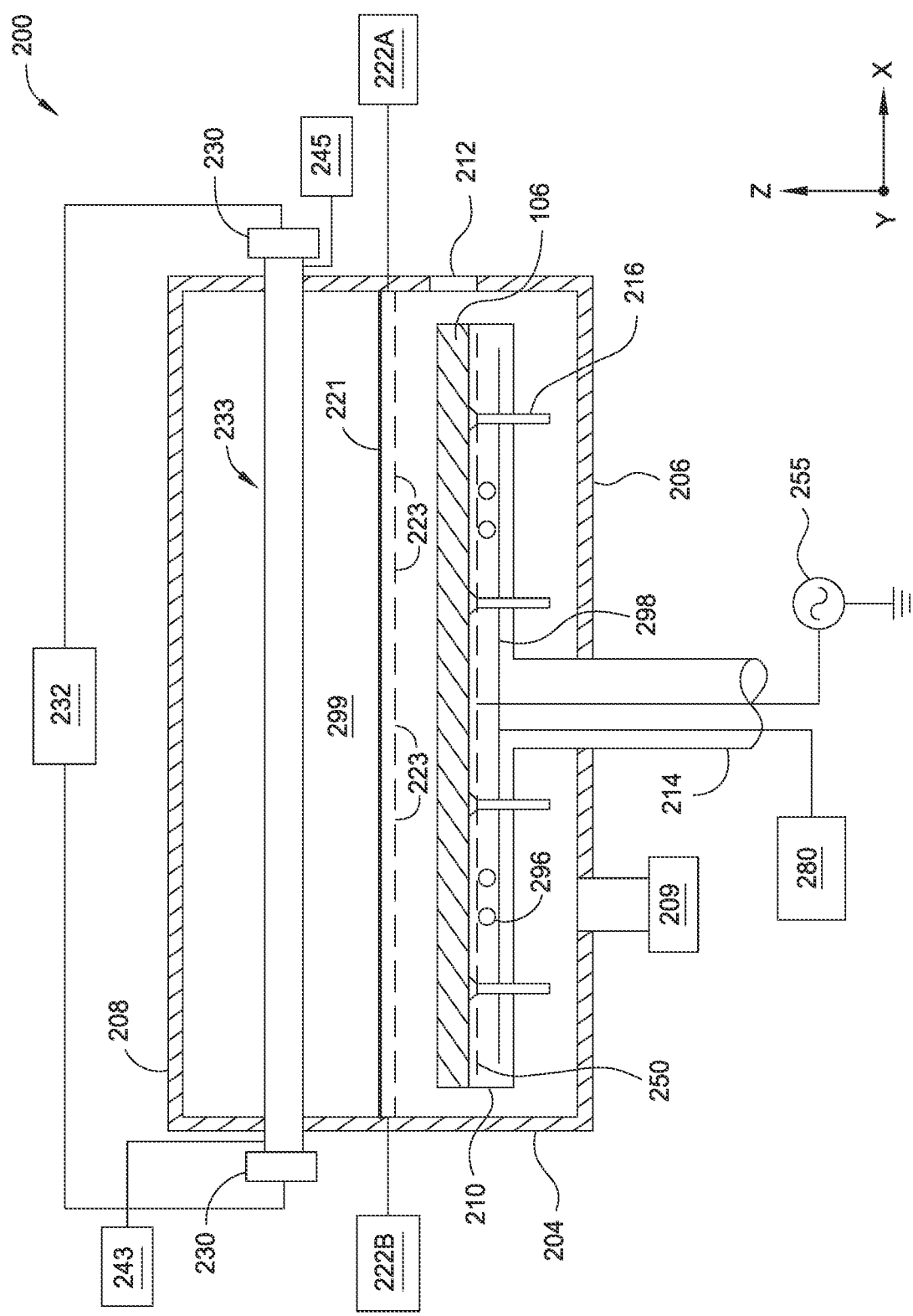
FIG. 2A is a schematic cross-sectional view of an exemplary process chamber, according to one embodiment.

FIG. 2A is a side cross-sectional schematic view of an exemplary process chamber 200, according to one embodiment. Referring to FIGS. 1 and 2A, the process chamber 200 is described. The process chamber 200 can be used for deposition of one or more of the layers included in the encapsulant 111 of FIG. 1. In some embodiments, the process chamber 200 may be further used to pretreat the OLED device 100 before the encapsulant 111 is formed over the OLED 102. In one embodiment, the process chamber 200 may be used to form one or more of the barrier layers 110, 114 of the encapsulant 111. The one or more barrier layers 110, 114 can be silicon nitride layers, deposited according to the methods described herein.

The process chamber 200 is configured to process large area substrates, such as substrates having a surface area greater than about 0.1 m$^2$, such as greater that about 2 m$^2$. The process chamber 200 is configured to process a substrate which is oriented in a horizontal position. In other embodiments, the methods described herein are used in a process chamber configured to process substrates oriented in a vertical or substantially vertical position.

The process chamber 200 features one or more side walls 204, a lid 208, and a bottom 206 which define a processing volume 299. The processing volume 299 is fluidly coupled to a vacuum 209 such as one or more dedicated vacuum pumps. The process chamber 200 further includes a substrate support 210 disposed therein. The substrate support 210 includes a shaft 214 extending through the chamber bottom 206, which raises and lowers the substrate support 210 to facilitate transfer of the substrate 106 to and from the process chamber 200.

The substrate 106 is loaded into the processing volume 299 through an opening 212 in one of the side walls 204, which is conventionally sealed with a door or a slit valve (not shown) during deposition or other processes. A plurality of lift pins 216 are movably disposed through the substrate support 210 to facilitate transferring of the substrate 106 to and from the substrate support 210. When the substrate support 210 is in a lowered position the plurality of lift pins 216 extend above the surface of the substrate support 210 to lift the substrate 106 for access by a robot handler (not shown). When the substrate support 210 is in a raised position the plurality of lift pins 216 are flush with, or below, the surface of the substrate support 210 and the substrate 106 rests directly on the substrate support 210 for processing. The lift pins 216 can be moved by contact of their lower ends with a stationary or movable pin plate (not shown). The substrate support 210 can further include a resistive heater 298 coupled to a controller 280 as well as cooling fluid conduits 296 that in combination are used to control the temperature of the substrate 106 disposed on the substrate support 210 during deposition.

In some embodiments, an electrical bias may be provided to the substrate support 210 during processing, such as during a deposition. The substrate support 210 can include a bias electrode 250 disposed on or in the substrate support 210. The bias electrode 250 is coupled to a bias power supply 255 which provides DC power, pulsed DC power, AC power, pulsed AC power, RF power, pulsed RF power, or a combination thereof. In one embodiment, the substrate support 210 is subjected to an electrical bias during deposition by charging the bias electrode 250 to create a negative bias on the substrate support 210 and/or the substrate 106. In some embodiments, the substrate support 210 further includes an electrostatic chuck electrode (not shown) on or in the substrate support 210. Typically, the electrostatic chuck electrode is coupled to a DC power source to retain the substrate 106 on a surface thereon.

The process chamber 200 further includes a plurality of tubular gas distribution conduits 221 and a plurality of antennas 233 each disposed above the substrate support 210 in the process chamber 200. The plurality of gas distribution conduits 221 can be used to distribute process gases from gas inlets 222A, 222B into the processing volume 299. The plurality of gas distribution conduits 221 are located between the substrate 106 disposed on the substrate support 210 and a plane in which the plurality of antennas 233 are located. In one embodiment, each gas distribution conduit 221 can be spaced apart from a surface of the substrate 106 by substantially the same vertical spacing distance, such as between about 3000 mil and about 10000 mil. A plurality of holes 223 disposed in the gas distribution conduits 221 face the substrate 106 and provide a substantially uniform gas flow over the surface of the substrate 106.

In some embodiments, such as embodiments in which a silicon nitride barrier layer (e.g., barrier layer 110 in FIG. 1) is formed, a silicon precursor and one or more nitrogen precursors, along with a carrier gas when used, are mixed to flow together through the same gas distribution conduit 221. Each end of the gas distribution conduit 221 is coupled to an individual gas inlet 222A or 222B to provide a more uniform pressure along the length of the gas distribution conduit 221, and thus a more uniform gas flow from the plurality of holes 223 disposed therein. In other embodiments, each of the precursor gases flow through separate gas distribution conduits 221 to prevent the precursor gases from reacting with each other before the precursor gases reach the surface of the substrate 106.

The process chamber 200 enables high-density plasma assisted chemical vapor deposition (CVD) process using the plurality of antennas 233 disposed within and extending across the processing volume 299. In this embodiment, the high-density plasma source is a linear microwave plasma source (LPS) (also referred to as antennas 233), however, the methods described herein can be used with any suitable high-density plasma source, such as electron cyclotron resonance (ECR) plasma source or an inductively coupled plasma (ICP) source. Importantly, these high-density plasma deposition techniques can achieve high deposition rates (e.g., 4000 Å/min) without any significant risk of arcing while there can be a significant risk of arcing inside CCP chambers or elsewhere in the RF circuit when similar deposition rates are attempted for CCP chambers. The occurrence of arcing during a plasma deposition is known to lead to unstable plasmas and nonuniform process results and can even damage the device being fabricated. Herein, the plurality of antennas 233 extend through a dielectric tube 237 (see FIG. 2C) extending across the process chamber 200 to provide an interior volume spanning the process chamber 200 isolated from the processing volume 299 of the process chamber 200. Each antenna 233 is located in an antenna plane between the chamber lid 208 and the planar arrangement of the plurality of gas distribution conduits 221. One or more microwave generators 230, each coupled to a power source 232, are coupled to one or both ends of each of the antennas 233. Cooling gas flow is provided to each of the antennas 233 from a cooling gas inlet 243 coupled to a first end of each of the dielectric tubes 237 and a cooling gas exhaust 245 coupled to a second end of each of the dielectric tube 237. Typical cooling gases include clean dry air (CDA) and $N_2$.

Figure 2B:
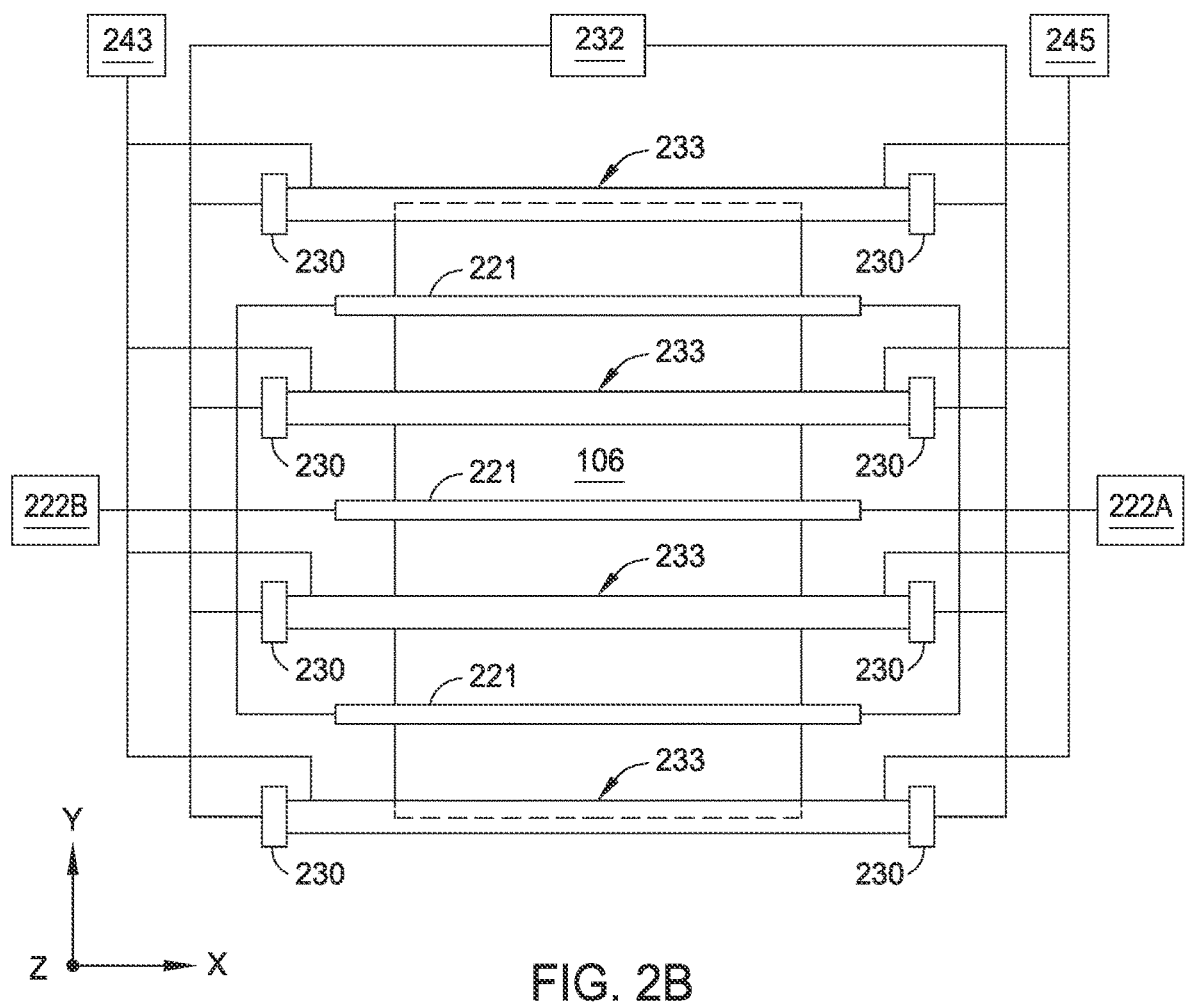
FIG. 2B illustrates a plan view of some features of the process chamber illustrated in FIG. 2A, according to one embodiment.
Figure 2C:
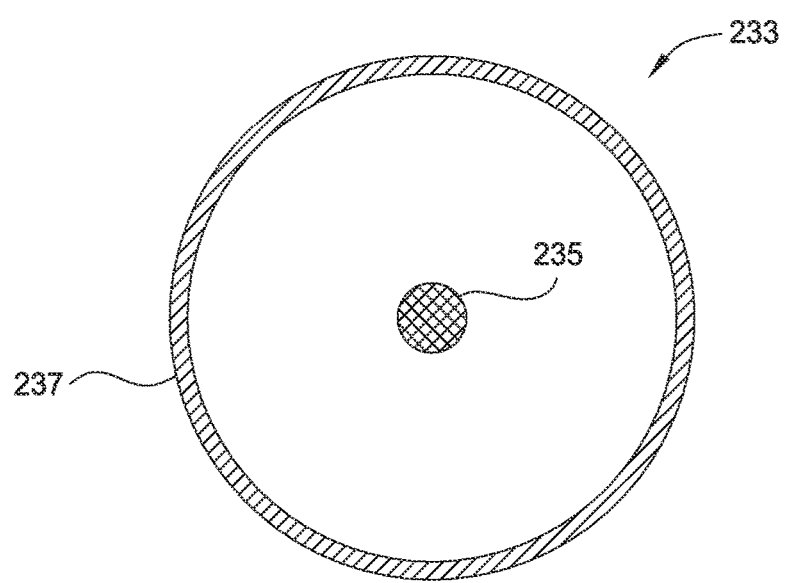
FIG. 2C is a cross sectional view of one of the plurality of antennas illustrated in FIG. 2B, according to one embodiment.

FIG. 2C is a cross sectional view of one of the plurality of antennas 233 illustrated in FIG. 2B, according to one embodiment. The antenna 233 generally includes a conductive stub 235 for radiating microwave energy into the processing volume 299 surrounded by a dielectric tube 237, such as a quartz tube, substantially coaxial therewith. Electromagnetic waves from the stubs 235 are radiated into the processing volume 299 through the dielectric tube 237 where they form a plasma of the process gases introduced from the plurality of gas distribution conduits 221.

FIG. 2B illustrates a plan view of some features of the process chamber 200 illustrated in FIG. 2A, according to one embodiment. The plurality of gas distribution conduits 221 are spaced apart from each other in a parallel arrangement above the substrate 106 on the substrate support 210 (see FIG. 2A for substrate support 210). Each gas distribution conduit 221 is located between two parallel antennas 233 of the plurality of antennas 233, which are also spaced apart from each other in a parallel arrangement above the substrate support 210 (FIG. 2A).

Figure 2D:
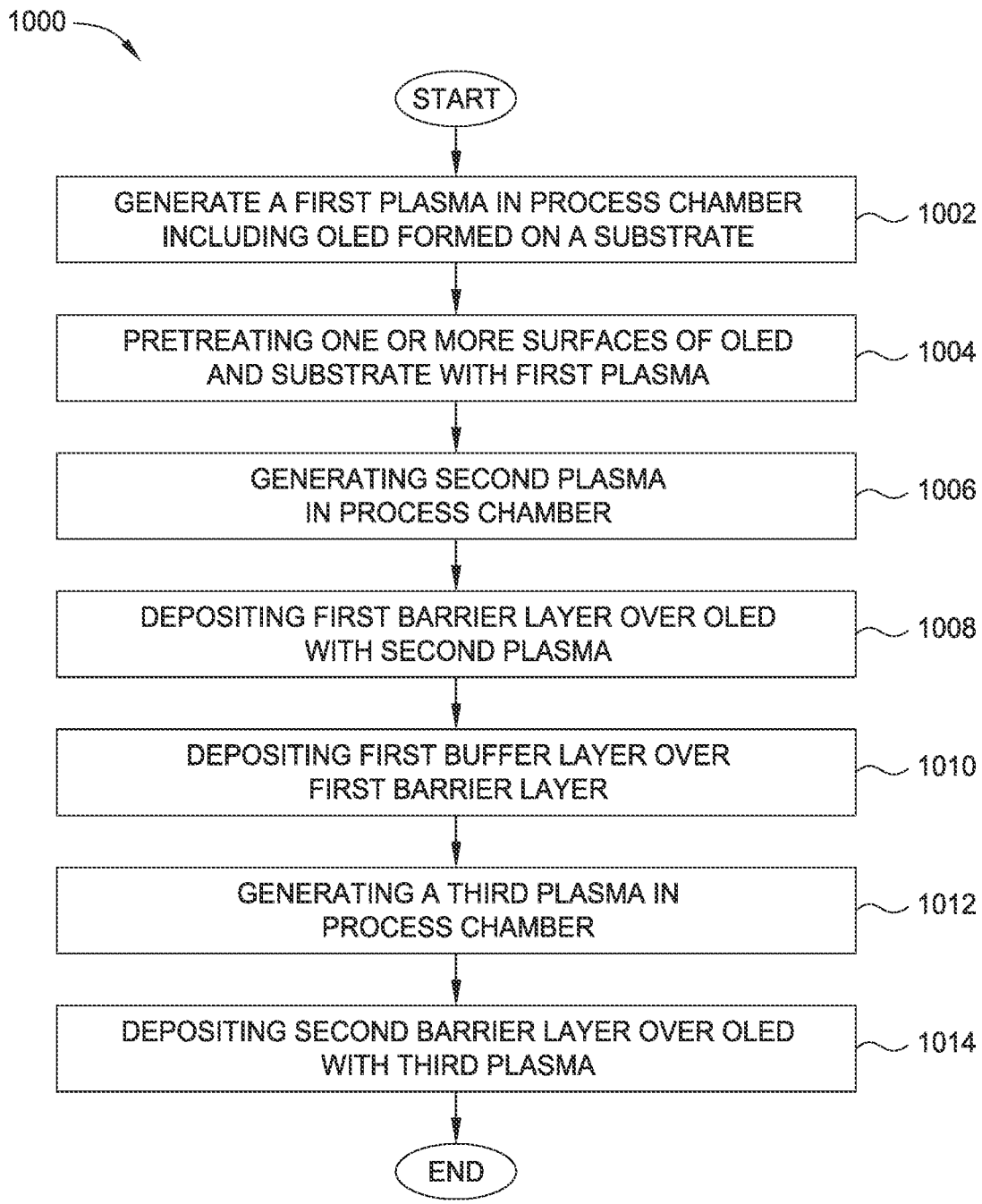
FIG. 2D is a process flow diagram of a method of encapsulating the organic light emitting diode OLED with the encapsulant of FIG. 1, according to one embodiment.

FIG. 2D is a process flow diagram of a method 1000 of encapsulating the OLED 102 with the encapsulant 111 of FIG. 1, according to one embodiment. In this exemplary embodiment, the method 1000 is executed using the process chamber 200 of FIG. 2A. Referring to FIGS. 1 and 2A-2D, the method 1000 is described.

At block 1002, a first plasma is generated over an OLED 102 formed on a substrate 106 that is disposed in the processing volume 299 of the process chamber 200. The first plasma can be a high-density plasma having an electron density of at least $10^{11}$ cm$^{-3}$. Generating the first plasma generally includes supplying a flow of a pretreatment process gas (e.g., a single gas molecule or atom) to the processing volume 299 of the process chamber 200 and igniting that gas into a plasma to pretreat the OLED 102 and the substrate 106. This first plasma pretreatment can improve interface properties of the OLED 102 and the substrate 106 to improve adhesion for when the first barrier layer 110 is formed over the OLED 102 and the substrate 106. In some embodiments, the first plasma can be formed from a pretreatment process gas that includes a nitrogen-containing and/or hydrogen-containing gas flow (e.g., $N_2$, $H_2$, $NH_3$, or $N_2O$) while in other embodiments, the first plasma can be formed from an inert gas (e.g., He or Ar). In some embodiments, the plasma generated can be dependent on the type of substrate being used. For example, an argon (Ar) plasma can be suitable for promoting adhesion to a PET substrate or a PEN substrate while a nitrogen ($N_2$) plasma can be more suitable for promoting adhesion to a copper substrate. Furthermore, an ammonia ($NH_3$) plasma can be more suitable for promoting adhesion for a glass substrate.

The flow rate of the pretreatment gas to the chamber is dependent on the size of the substrate and the process chamber. For example, for a chamber sized to process a 500 mm by 730 mm substrate, the total flow rate of the pretreatment process gas including N2 can be between about 150 sccm and about 3,000 sccm, such as between about 250 sccm and about 1,500 sccm, such as between about 300 sccm and about 900 sccm, such as about 480 sccm. The first plasma can be formed by the linear microwave plasma source (LPS) 233. The LPS 233 can have power supplied at both ends of the conductive stub 235 at a frequency of between about 1 GHz and about 10 GHz, such as about 2.45 GHz or about 5.8 GHz. The power used is dependent on the size of the chamber, for example, for a chamber sized for a 500 mm by 730 mm substrate, the power can be set between about 500 W and about 8000 W, such as between about 500 W and about 5000 W, such as between about 1000 W and 4000 W. Appropriate scaling may be used for chambers sized for other substrates where the power is set at between about 130 mW/cm2 and about 2300 mW/cm2, such as between about 130 mW/cm2 and about 1400 mW/cm2, such as between about 270 mW/cm2 and about 1100 mW/cm2. In other embodiments, the high-density plasma can be formed by inductively coupled plasma (ICP) source having a frequency of between about 1 MHz and about 20 MHz.

At block 1004, one or more surfaces of the OLED 102 and the substrate 106 are pretreated with the first plasma for a period of time during which the first plasma having the electron density of at least 1011 cm-3 is maintained.

At block 1006, a second plasma is generated in the processing volume 299 of the process chamber 200. The second plasma can be a high-density plasma having an electron density of at least 1011 cm-3. The gases provided to form the second plasma can include a silicon precursor gas and a nitrogen precursor gas, which are flowed into the processing volume 299 of the processing chamber 200 through the plurality of linear gas distribution conduits 221. The silicon precursor gas is any suitable silicon containing gas such as silane (SiH4), disilane (Si2H6), trisilane (Si3H3), tetrasilane (Si4H10), silicon tetrafluoride (SiF4), silicon tetrachloride (SiCl4), dichlorosilane (SiH2Cl2), or mixtures thereof. The nitrogen precursor gas is any suitable nitrogen containing gas such as (N2), ammonia (NH3), diazene (N2H2) hydrazine (N2H4), or mixtures thereof. In some embodiments, a carrier gas is also provided such as argon (Ar), hydrogen (H2), helium (He), derivatives thereof, or mixtures thereof. In one embodiment, silane (SiH4), ammonia (NH4) and nitrogen (N2) are co-flowed through the plurality of linear gas distribution conduits 221 and into the processing volume 299. Herein, the silicon precursor gas and the nitrogen precursor gas are co-flowed through the same linear gas distribution conduit 221. In other embodiments, the precursor gases are flowed through separate gas distribution conduits 221 to prevent the precursor gases from prematurely reacting in the gas distribution conduits 221.

The flow rates of the precursor gases to the chamber are dependent on the size of the substrate and the process chamber. For example, for a chamber sized to process a 500 mm by 730 mm substrate, the total flow rate of a silicon precursor gas including SiH4 is between about 150 sccm and about 3,000 sccm, such as between about 250 sccm and about 1,500 sccm, such as between about 300 sccm and about 900 sccm, such as about 480 sccm. The flow rate of nitrogen precursor gas including NH3 to the chamber is between about 1,200 sccm and about 5,000 sccm, such as between about 2,000 sccm and about 4,000 sccm, such as about 3,000 sccm. When used, the flow rate of a carrier gas including Ar or N2 is between about 450 sccm and about 5,000 sccm, such as between about 500 sccm and about 3,500 sccm, for example about 2,500 sccm. Appropriate scaling may be used for chambers sized for other substrates where the gas flow ratio of SiH4 to NH3 (SiH4:NH3) can be between about 1:2 and about 1:6, for example, about 1:3. The gas flow ratio of SiH4 to Ar (SiH4:Ar), when Ar is used, can be between about 1:1 and about 1:20, for example, between about 1:5 and about 1:10. The gas flow ratio of NH3 to Ar (NH3:Ar), when Ar is used, can be between about 1:1 and about 1:10, for example, between about 1:2 and about 1:5. The chamber pressure is maintained below 1 Torr, such as between about 50 mTorr and about 250 mTorr, such as below about 200 mTorr, such as below about 125 mTorr. The substrate 106 can be spaced apart from linear gas distribution conduits 221 by a spacing distance of between about 3000 mil and about 10000 mil, such as about 7000 mil.

The high-density plasma, where the electron density is more than about 1011/cm3, is formed using the carrier gas (when used), the silicon precursor gas, and the nitrogen precursor gas by the linear microwave plasma source (LPS) 233. The LPS 233 can have power supplied at both ends of the conductive stub 235 at a frequency of between about 1 GHz and about 10 GHz, such as about 2.45 GHz or about 5.8 GHz. The power used is dependent on the size of the chamber, for example, for a chamber sized for a 500 mm by 730 mm substrate, the power can be set between about 500 W and about 8000 W, such as between about 500 W and about 5000 W, such as between about 1000 W and 4000 W. Appropriate scaling may be used for chambers sized for other substrates where the power is set at between about 130 mW/cm2 and about 2300 mW/cm2, such as between about 130 mW/cm2 and about 1400 mW/cm2, such as between about 270 mW/cm2 and about 1100 mW/cm2. In other embodiments, the high-density plasma can be formed by inductively coupling a plasma source power (ICP) having a frequency of between about 1 MHz and about 20 MHz, such as about 13.56 MHz.

At block 1008, the first barrier layer 110 including silicon and nitrogen is deposited over the OLED 102 by maintaining the second plasma for a period of time. In one embodiment, the second plasma is maintained to form a first barrier layer 110 having a thickness from about 50 Å to about 5000 Å, such as about 100 Å to about 2500 Å, such as about 2000 Å or about 1000 Å. As described above, forming the first barrier layer 110 with the high-density plasma can result in a barrier layer of a given thickness (e.g., 1000 Å) with improved moisture-blocking and oxygen-blocking properties relative to a barrier layer of the same thickness formed with a lower-density plasma. It is thought that at least some of the improved moisture-blocking and oxygen-blocking properties of the barrier layer formed from the high-density plasma is due to the reduced amount of damage to the barrier layer being formed from the high-density plasma that has a lower rate of ion bombardment relative to a lower-density plasma. The lower rate of ion bombardment results in less pin holes in the barrier layer formed and the high-density plasma results in a denser layer being formed, which both lead to improved moisture-blocking and oxygen-blocking properties of the barrier layer relative to a barrier layer formed from a lower-density plasma.

At block 1010, the buffer layer 112 is formed (e.g., deposited) over the first barrier layer 110. In one embodiment, the buffer layer 112 is formed of hexamethyldisiloxane (HMDSO) layer. In some embodiments, the buffer layer is formed in the process chamber 200 while in other embodiments, the buffer layer 112 can be formed in another process chamber.

At block 1012, a third plasma is generated in the processing volume 299 of the process chamber 200. The third plasma can be a high-density plasma having an electron density of at least 1011 cm-3. In some embodiments, the third plasma is generated using the same or similar method as described above in reference to generating the second plasma (i.e., same gases, gas flow rates, power and frequency supplied from LPS, pressure, temperature, etc.).

At block 1014, the second barrier layer 114 including silicon and nitrogen is deposited over the OLED 102 by maintaining the third plasma for a period of time. In one embodiment, the third plasma is maintained to form a second barrier layer 114 having a thickness from about 50 Å to about 5000 Å, such as about 100 Å to about 2500 Å, such as about 2000 Å or about 1000 Å.

Although the second plasma and the third plasma which are used to form the respective barrier layers 110, 114 are described as being high-density plasmas, in some embodiments at least one of the barrier layers 110, 114 can be formed from a plasma having a lower density, such as a plasma having an electron density around 109 cm-3, for example using a capacitively coupled plasma. In some of these embodiments, the barrier layer formed from the lower-density plasma can help reduce a stress mismatch between the barrier layers and the buffer layer in between the barrier layers. This reduced stress mismatch can help prevent the encapsulant from cracking when the OLED device is subject to external stresses, such as bending.

Figure 3A:
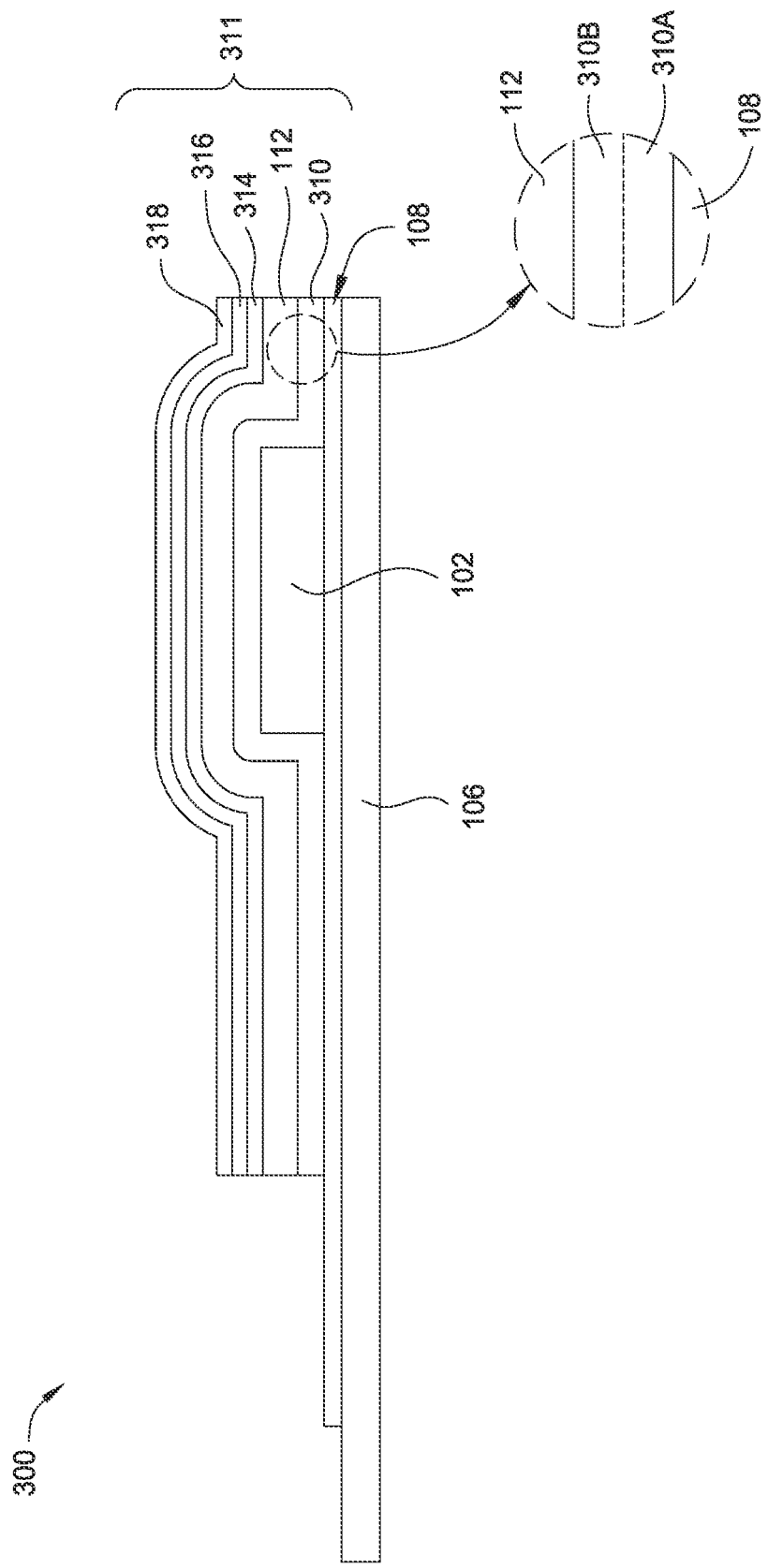
FIG. 3A is a side cross-sectional view of an OLED device including the OLED of FIG. 1 and an encapsulant formed over the OLED, according to another embodiment.

FIG. 3A is a side cross-sectional view of an OLED device 300 including the OLED 102 and an encapsulant 311 formed over the OLED 102, according to another embodiment. The OLED device 300 is similar to the OLED device 100 except that the OLED device 300 includes the encapsulant 311 instead of the encapsulant 111 described above. The encapsulant 311 is similar to the encapsulant 111 described above except that the barrier layers 110, 114 from the encapsulant 111 are replaced with barrier layers 310, 314. Furthermore, the encapsulant 311 additionally includes a second buffer layer 316 and a third barrier layer 318.

In some embodiments, the barrier layers 310, 314 can be the same as the barrier layers 110, 114 described above. In other embodiments, one or more of the barrier layers can be formed of two portions including a portion formed using a high-density plasma and a second portion using a lower-density plasma. For example, in the lower right side of FIG. 3A, a closeup of barrier layer 310 is shown including a first portion 310A and a second portion 310B. In one embodiment, the first portion 310A can be formed using a high-density plasma (i.e., a plasma having an electron density of greater than of around 1011 cm-3) and the second portion 310B can be formed using a lower-density plasma (i.e., a plasma having an electron density of around 109 cm-3, such as an electron density from about 5107 cm-3 to about 5109 cm-3).

Any portions formed using a high-density plasma can be formed using the methods described above in reference to the barrier layer 110 of FIG. 1. The first portion 310A can have a thickness from about 50 Å to about 5000 Å, such as about 100 Å to about 2500 Å. The first portion 310A and the second portion 310B can be formed of the same material (e.g., silicon nitride), but forming the portions 310A, 310B from plasmas having significantly different densities (e.g., different by a factor of 100 or more) can alter many properties of the resulting portions 310A, 310B of the barrier layer. For example, in one embodiment the first portion 310A can be deposited using a high-density plasma to form a barrier layer portion having a tensile stress and an improved WVTR (i.e., lower WVTR) relative to a portion of the same thickness formed from a lower-density plasma while the second portion 310B can be deposited using a lower-density plasma to form a barrier layer portion having a compressive stress. The second portion 310B having the compressive stress can form an improved interface with the buffer layer 112 deposited over the first barrier layer 310 relative to a barrier layer portion having a tensile stress. Thus, the resulting barrier layer 310 including the portions 310A, 310B provides a barrier layer that is superior to a barrier layer formed from only a high-density plasma or only a lower-density plasma.

Although the barrier layer 310 is shown including two portions 310A, 310B, in other embodiments the barrier layer may include additional portions formed using other combinations of high-density plasmas and lower-density plasmas as well as including portions formed from plasmas having other densities, such as a barrier layer including three or more portions formed using at least three different plasmas including a high-density plasma (e.g., an electron density of at least 1011 cm-3), a medium density plasma (e.g., an electron density of about 1010 cm-3), and a lower density plasma (e.g., an electron density of less than 109 cm-3). Furthermore, although only the barrier layer 310 is shown including multiple portions formed from plasmas having different densities, in some embodiments one or more of the barrier layers 314 and 318 may include multiple portions formed from plasmas having different densities as well.

The second buffer layer 316 can be similar to the buffer layer 112 described above in reference to FIG. 1. For example, in some embodiments the second buffer layer 316 is formed of the same materials using the same methods as the buffer layer 112 described above. Similarly, the second barrier layer 314 and the third barrier layer 318 can be similar to the first barrier layer 110 or the second barrier layer 114 described above in reference to FIG. 1 or similar to the barrier layer 310 described in reference to FIG. 3A. The encapsulant 311 can have a total thickness from about 5,000 Å to about 25,000 Å.

Figure 3B:
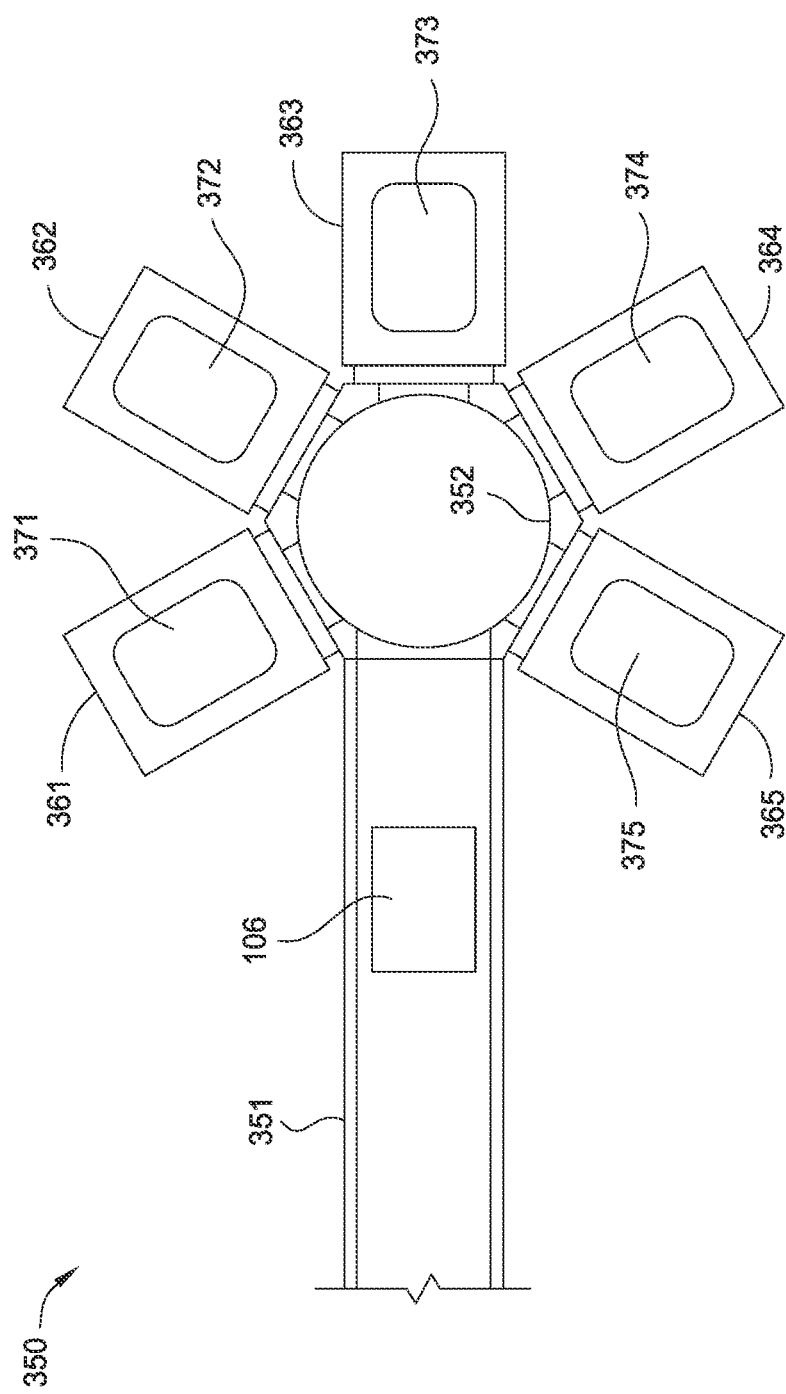
FIG. 3B is a schematic plan view of a cluster tool that can be used to form the encapsulant over the OLED of the OLED device of FIG. 3A, according to one embodiment.

FIG. 3B is a schematic plan view of a cluster tool 350 that can be used to form the encapsulant 311 over the OLED 102 of the OLED device 300 of FIG. 3A, according to one embodiment. The cluster tool 350 includes a conveyor 351 that leads to a transfer chamber 352. The cluster tool 350 further includes a first process chamber 361, a second process chamber 362, a third process chamber 363, a fourth process chamber 364, and a fifth process chamber 365. Each process chamber 361-365 can include a corresponding plasma source 371-375. The plasma source of a given process chamber can include, for example, an LPS, an ECR plasma source, an ICP source, or a CCP source. In some embodiments, a process chamber can include more than one plasma source, such as an LPS and a CCP source.

The transfer chamber 352 can include a robot (not shown) to transfer substrates 106 to and from each of the process chambers 361-365 and to and from the conveyor 351. The robot (not shown) in the environmentally controlled transfer chamber 352 (e.g., vacuum and/or low H2O or O2 content environment) can be used to transfer the substrate 106 to each of the different process chambers 361-365, so that each of the layers in the encapsulant 311 can be successively formed to encapsulate each OLED 102 on each substrate 106. Although five process chambers are shown in the cluster tool 350, in other embodiments a cluster tool may include more or less process chambers, such as dual process chamber tool where one process chamber is used to form barrier layers or portions thereof using high-density plasmas and the other process chamber is used to form buffer layers and at least a portion of one barrier layer using lower-density plasmas.

Each process chamber 361-365 can be a plasma enhanced chemical vapor deposition (PECVD) chamber, where some of the process chambers 361-365 can be classified as high-density plasma chambers, such as chambers that can produce a plasma having an electron density of 1011 cm-3 or higher, and some of the other process chambers 361-365 can be more generally classified as lower-density plasma chambers, such as chambers that can produce a plasma having an electron density of around 109 cm-3, such as an electron density from about 5*107 cm-3 to about 5*109 cm-3. The process chamber 200 described above in reference to FIG. 2A employing the linear microwave plasma source is an exemplary chamber that can be used to produce a high-density plasma chamber, but plasma chambers including an inductively coupled plasma (ICP) source or an electron cyclotron resonance (ECR) plasma source may also be used to generate the high-density plasmas used in forming the encapsulant 311. Exemplary lower-density plasma chambers can include capacitively coupled plasma chambers.

In one embodiment, the first process chamber 361, the third process chamber 363, and the fifth process chamber 365 can be used to deposit barrier layers or portions of barrier layers using high-density plasmas. For example, in this embodiment the first process chamber 361 can be used to deposit the first portion 310A of the first barrier layer 310, and the second process chamber 362 can be used to deposit the second portion 310B of the first barrier layer 310 of the encapsulant 311. Furthermore, in this embodiment, the third process chamber 363 can be used to deposit the buffer layers 112, 316 of the encapsulant 311. Finally, the fourth and fifth process chambers 364, 365 can be used to deposit the second barrier layer 314 and the third barrier layer 318 respectively of the encapsulant 311. In this embodiment, the first, fourth, and fifth process chambers 361, 364, and 365 can be configured to form high-density plasmas while the second and third process chambers 362, 363 can be configured to form lower-density plasmas. For example, the first, fourth, and fifth plasma sources 371, 374, 375 can be linear microwave plasma sources (LPS) while the second and third plasma sources 372, 373 can be capacitively coupled plasma (CCP) sources.

Figure 3C:
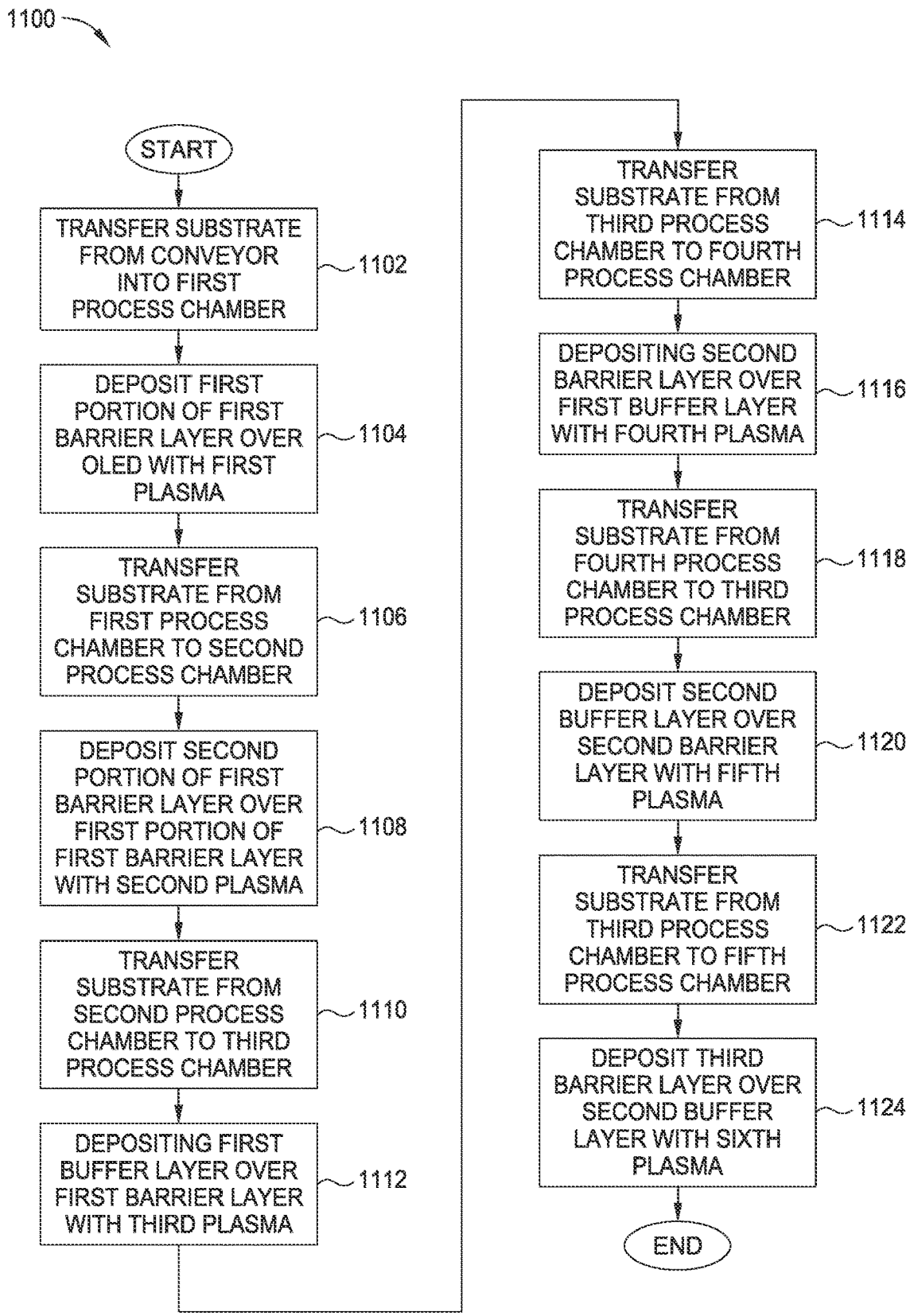
FIG. 3C is a process flow diagram of a method of encapsulating the OLED with the encapsulant of FIG. 3A using the cluster tool of FIG. 3B, according to one embodiment.

FIG. 3C is a process flow diagram of a method 1100 of encapsulating the organic light emitting diode (OLED) 102 with the encapsulant 311 of FIG. 3A using the cluster tool 350 of FIG. 3B, according to one embodiment. Referring to FIGS. 3A-3C, the method 1100 is described.

At block 1102, the substrate 106 is transferred from the conveyor 351 through the transfer chamber 352 and into the first process chamber 361. At block 1104, a high-density plasma (first plasma) is generated in the first process chamber 361 and the first portion 310A of the first barrier layer 310 is deposited over the OLED 102 with the high-density plasma (first plasma). In some embodiments, the substrate and OLED may be pretreated before executing block 1104 using a same or similar operation described in reference to block 1004 of FIG. 2D above.

At block 1106, the substrate 106 is transferred from the first process chamber 361 through the transfer chamber 352 to the second process chamber 362. At block 1108, a lower-density plasma (second plasma) is generated in the second process chamber 362 and the second portion 310B of the first barrier layer 310 is deposited over the OLED 102 with the lower-density plasma (second plasma). The density of the lower-density plasma (e.g., 109 cm-3) in block 1108 can differ from the density of the high-density plasma in block 1104 by a factor of at least 100.

At block 1110, the substrate 106 is transferred from the second process chamber 362 through the transfer chamber 352 to the third process chamber 363. At block 1112, a lower-density plasma (third plasma) is generated in the third process chamber 363 and the first buffer layer 112 is deposited over the first barrier layer 310 with the lower-density plasma (third plasma).

At block 1114, the substrate 106 is transferred from the third process chamber 363 through the transfer chamber 352 to the fourth process chamber 364. At block 1116, a high-density plasma (fourth plasma) is generated in the fourth process chamber 364 and the second barrier layer 314 is deposited over the first buffer layer 112 with the high-density plasma (fourth plasma).

At block 1118, the substrate 106 is transferred from the fourth process chamber 364 through the transfer chamber 352 to the third process chamber 363. At block 1120, a lower-density plasma (fifth plasma) is generated in the third process chamber 363 and the second buffer layer 316 is deposited over the second barrier layer 314 with the lower-density plasma (fifth plasma).

At block 1122, the substrate 106 is transferred from the third process chamber 363 through the transfer chamber 352 to the fifth process chamber 365. At block 1124, a high-density plasma (sixth plasma) is generated in the fifth process chamber 365 and the third barrier layer 318 is deposited over the second buffer layer 316 with the high-density plasma (sixth plasma).

The methods 1000 and 1100 provide examples of forming encapsulants over an OLED with improved barrier properties against moisture and oxygen ingress therethrough to the underlying OLED device when compared to an encapsulant formed using only a conventional capacitively coupled plasma (CCP) PECVD deposition process, as demonstrated in FIGS. 4A-4I. FIGS. 4A-4I show comparative measurements of barrier properties and other properties of silicon nitride layers deposited using high-density plasma chemical vapor deposition (HDP-CVD) processes, according to embodiments described herein, and of silicon nitride films deposited using conventional capacitive coupled plasma (CCP) PECVD deposition.

Figure 4A:
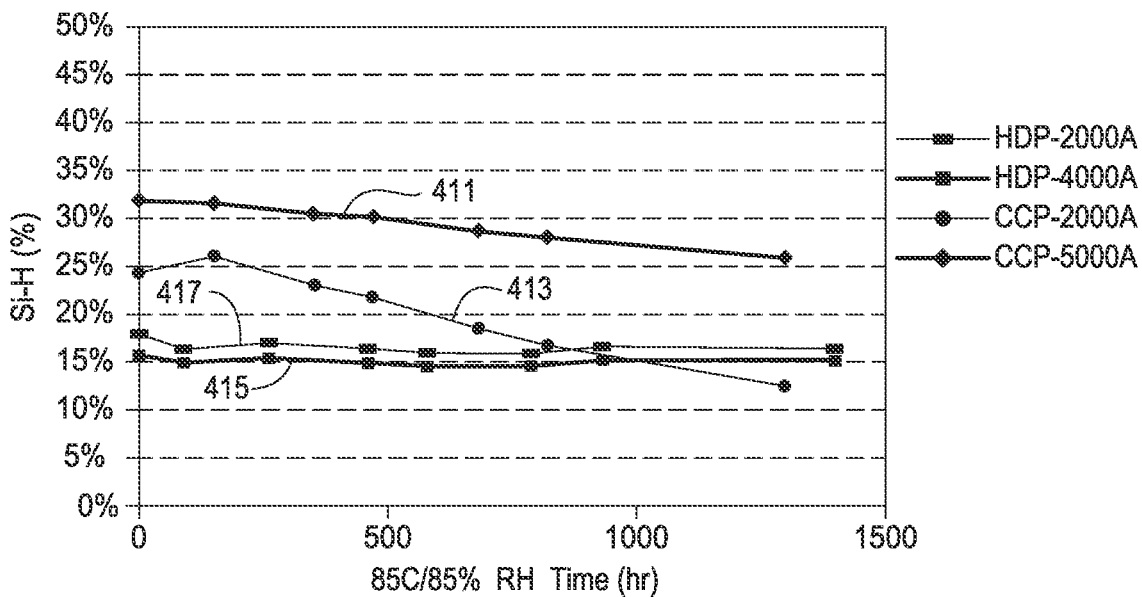
FIGS. 4A-4I show comparative measurements of barrier properties and other properties of silicon nitride layers deposited using high-density plasma chemical vapor (HDP-CVD) deposition processes, according to embodiments described herein, and of silicon nitride films deposited using conventional capacitive coupled plasma (CCP) PECVD deposition.
Figure 4B:
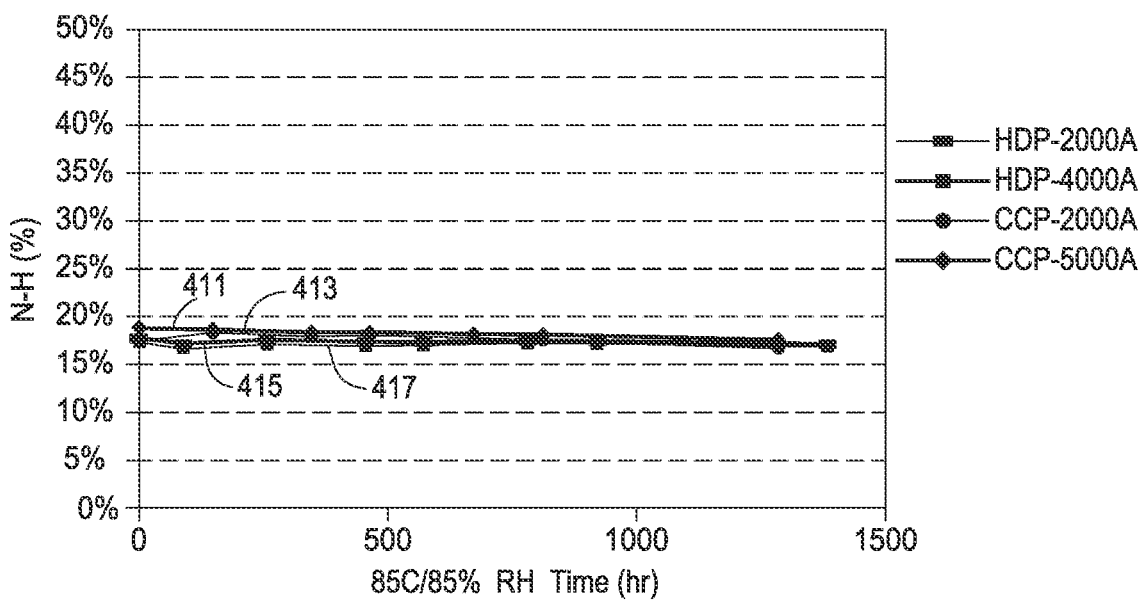

FIGS. 4A-4B show the % of Si—H bonds in FIG. 4A and the % of N—H bonds in FIG. 4B for silicon nitride layers formed using HDP-CVD and CCP-CVD when these silicon nitride layers are held at 85° C. and 85% relative humidity from zero hours to less than about 1500 hours. As can be seen in FIG. 4A a 2000 Å HDP layer 415 and a 4000 Å HDP layer 417 of silicon nitride initially both showed fewer Si—H bonds than a 2000 Å CCP layer 413 and a 5000 Å CCP layer 411 of silicon nitride at zero hours, but the % of Si—H bonds in the CCP silicon nitride layers 411 and 413 declines over time. While Si—H bonds are not necessarily undesirable in a silicon nitride layer used as a barrier layer in a thin-film encapsulation structure, the decline in the % of Si—H over time of the 2000 Å CCP layer 413 and a 5000 Å CCP layer 411 indicate that the Si—H bonds are being replaced with undesirable Si—O bonds. This demonstrates the relative instability of conventionally deposited CCP silicon nitride layers 411 and 413 when compared to the HDP silicon nitride layers 415 and 417. FIG. 4B illustrates that both the HDP deposited layers and the CCP deposited layers are relatively stable with respect to the % of N—H bonds over time.

Figure 4C:
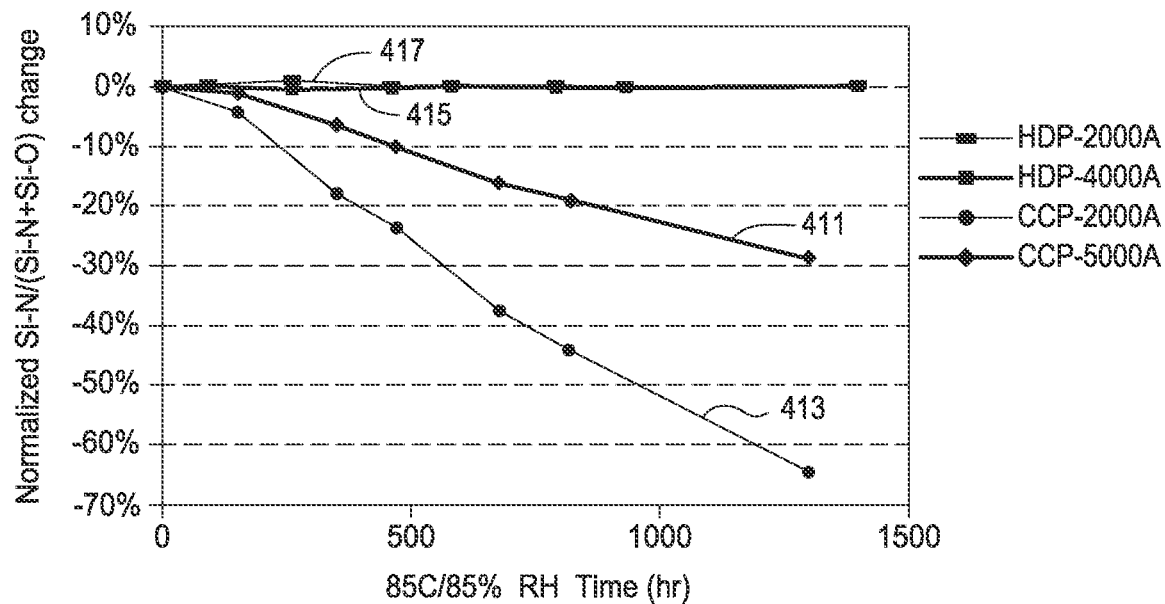
Figure 4D:
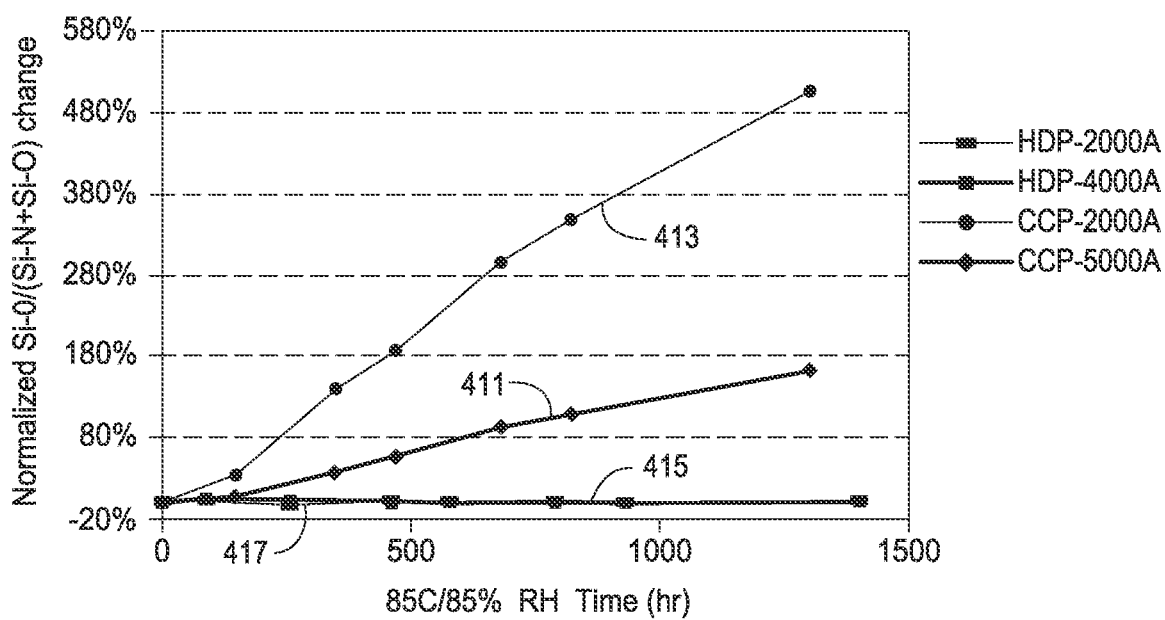

FIG. 4C shows the % change in the concentration of Si—N bonds in deposited silicon nitride layers from zero hours to less than about 1500 hours when exposed to 85° C. and 85% relative humidity. FIG. 4D shows the % change in the concentration of Si—O bonds in the deposited silicon nitride layers of FIG. 4C over the same time period. The percentage change in concentration values in 4C and 4D have been normalized. As seen in FIGS. 4C and 4D the Si—O concentration of the CCP deposited layers 411 and 413 increases with time and predictably results in a decrease in Si—N concentration in the deposited layers while the HDP silicon nitride layers remain stable with no to little perceptible shift in Si—O or Si—N over the same time period indicating that the HDP silicon nitride layers have superior barrier properties to oxygen penetration when compared to CCP silicon nitride layers.

Figure 4E:
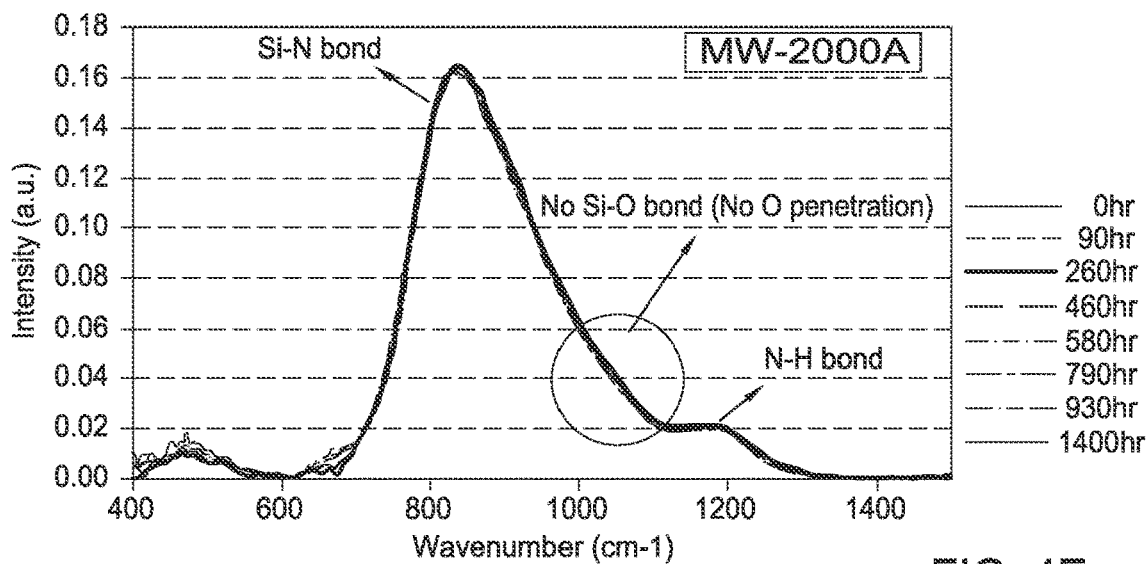
Figure 4F:
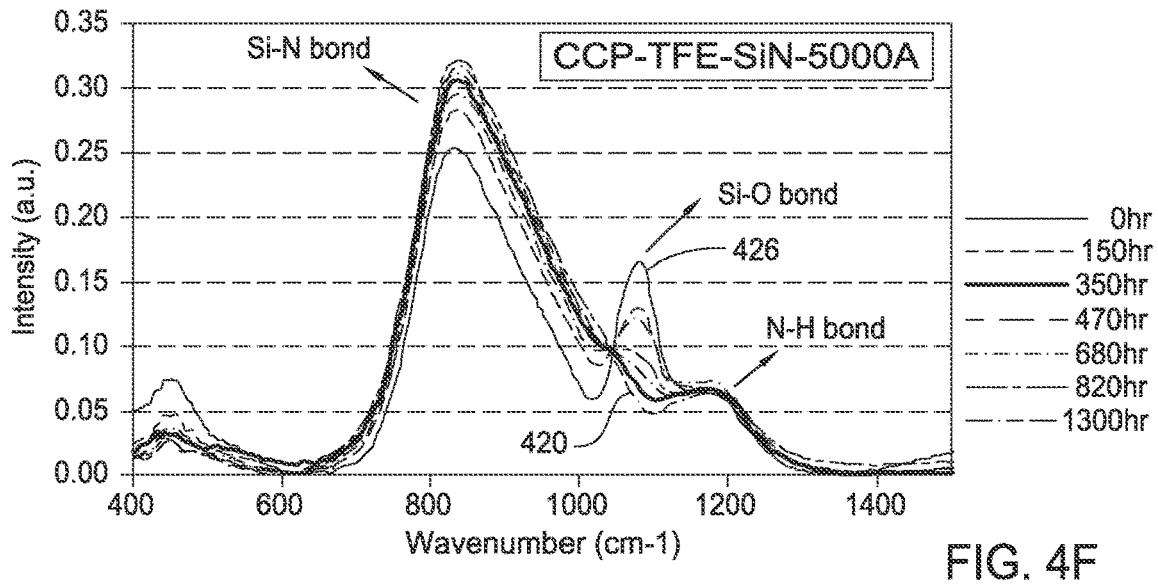
Figure 4G:
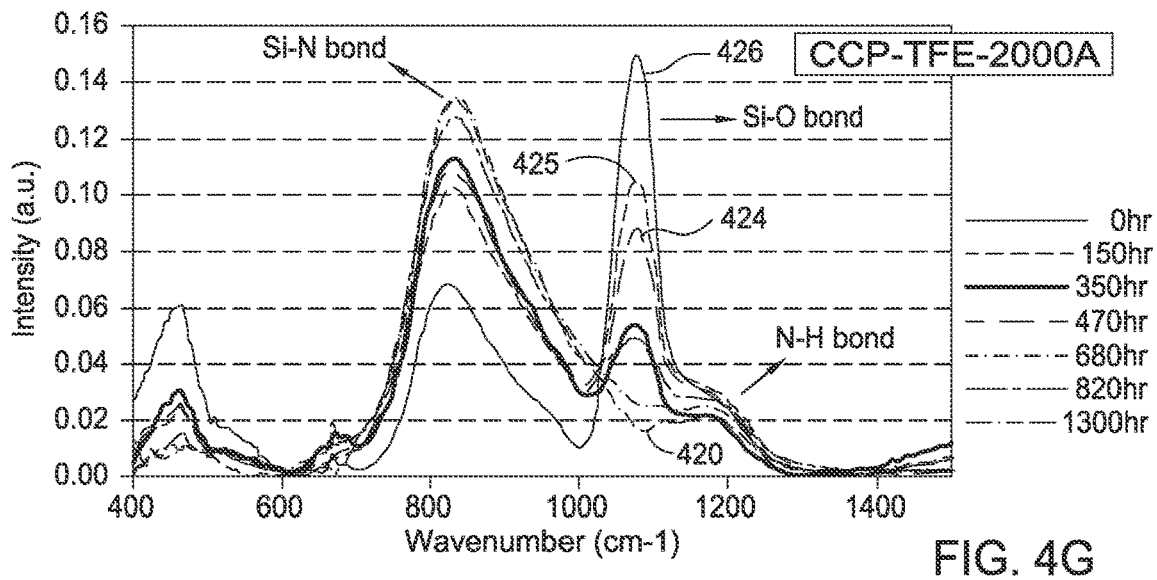
Figure 4H:
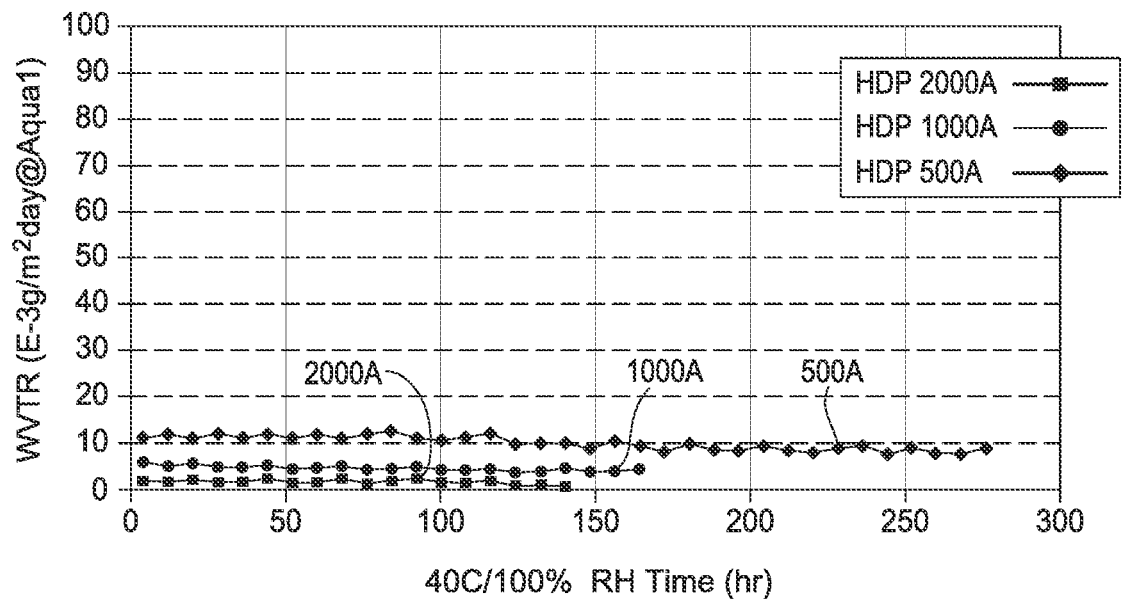
Figure 4:
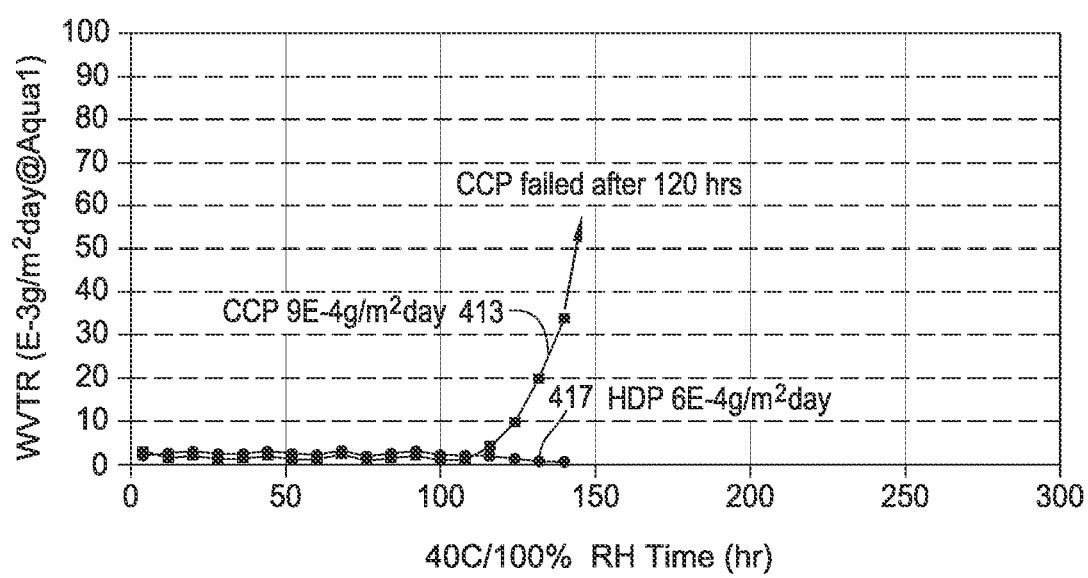
Figure 5A:
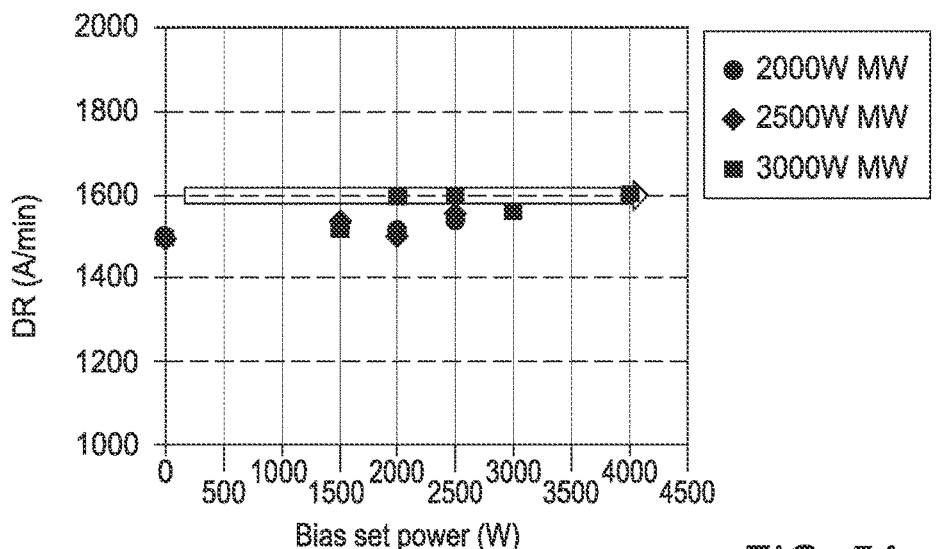
FIGS. 5A-5F illustrate the effect biasing the substrate support can have on the properties of silicon nitride layers deposited using an HDP-CVD process.
Figure 5B:
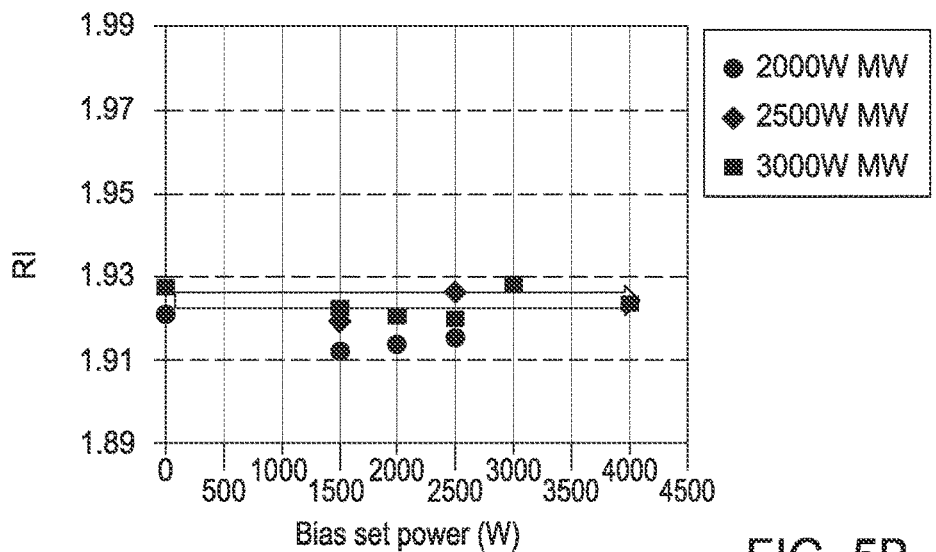
Figure 5C:
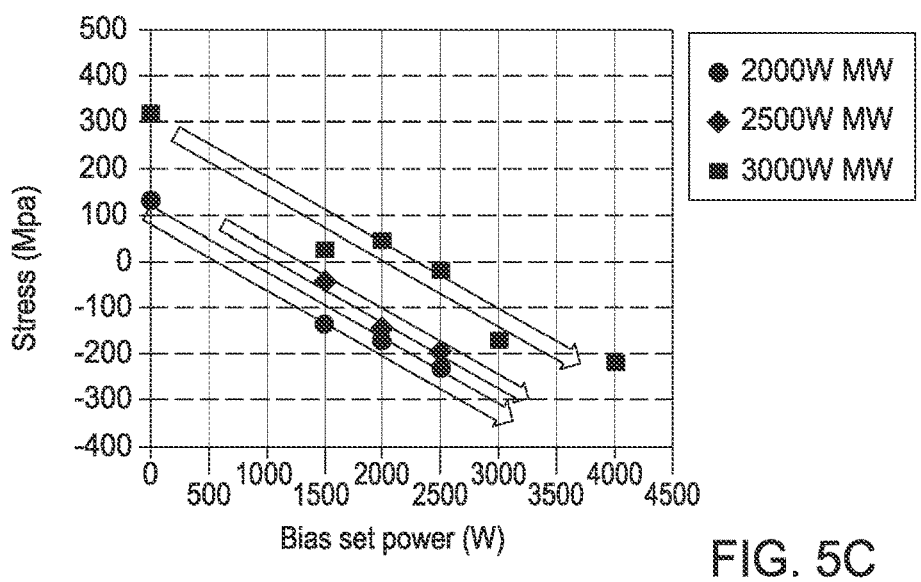
Figure 5D:
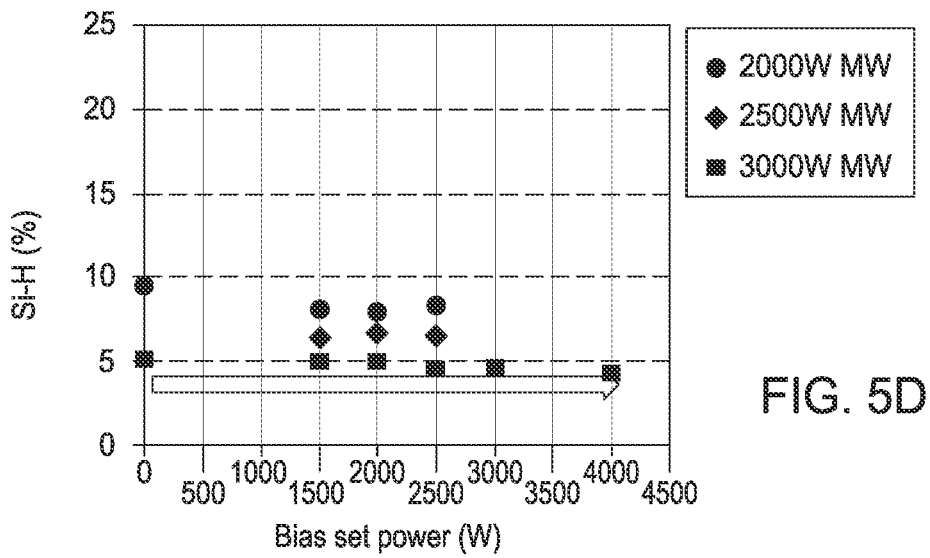
Figure 5E:
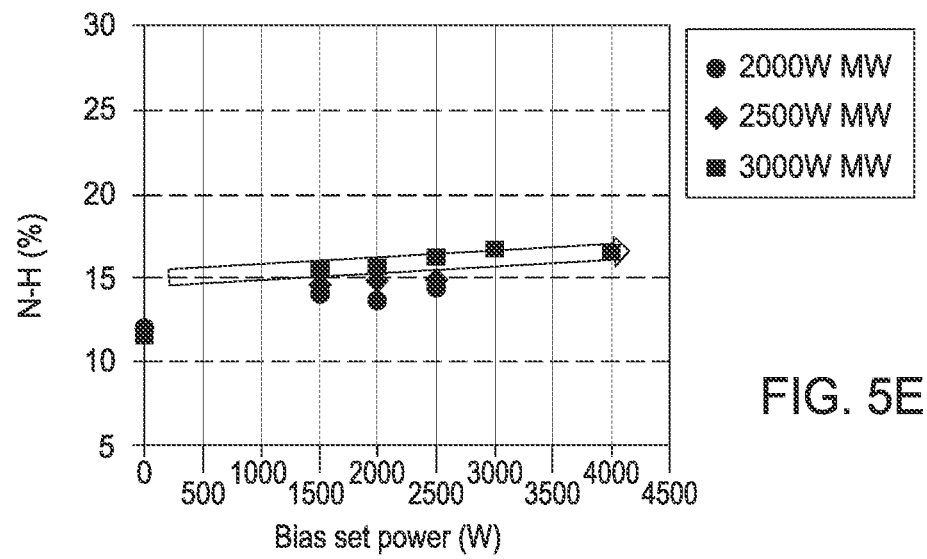
Figure 5F:
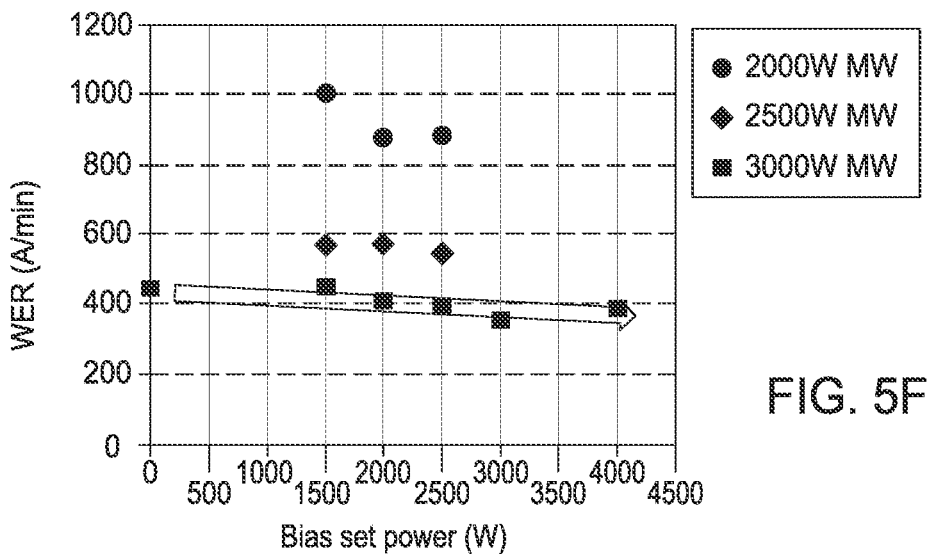

FIGS. 4E-4G show FTIR spectrums of HDP (FIG. 4E) and CCP (FIGS. 4F and 4G) silicon nitride layers after exposure to 85° C. and 85% relative humidity at zero hours to about 1400 hours, and increments in between. FIG. 4E shows that a 2000 Å HDP silicon nitride layer shows little to no change in the composition of the film from zero hours to about 1400 hours of exposure. In particular, there was little to no change in the concentrations of Si—O bonds and Si—N bonds observed up to 1400 hours indicating that there was no to little undesirable oxygen penetration of the 2000 Å HDP layer. However, the conventional 5000 Å silicon nitride layer shows measurable increases in the concentrations of Si—O bonds from measurements taken from zero hours (420) to 1300 hours (426) and as seen in FIG. 4F. Probable oxygen penetration is even more discernable in the 2000 Å CCP layer from 0 hours (420) to 680 hours (424), 820 hours of exposure (425), and 1300 hours of exposure (426) as the 2000 Å CCP layers shows higher concentration of Si—O bonds at increasing time intervals when compared to the 5000 Å CCP layers. FIGS. 4E-4G demonstrate that HDP silicon nitride layers, deposited according to embodiments disclosed herein, are a superior barrier to oxygen penetration than conventionally deposited CCP silicon nitride layers FIGS. 4H and 4I show the water vapor transmission rate (WVTR) of silicon nitride layers exposed to 40° C. and 100% relative humidity where lower WVTR indicate the silicon nitride layer's resistance to permeation of water therethrough. FIG. 4I shows the 2000 Å HDP layer 417 compared to the 2000 Å CCP layer 413, wherein the HDP layer has a relatively stable WVTR of about 1×10-4 g/m2 day with little to no change between zero hours and about 140 hours while the 3000 Å CCP layer 413 failed after about 120 hours when it no longer exhibited a measurable resistance to water permeation. FIG. 4H shows the WTVR of silicon nitride HDP layers over time and up to between about 140 hours to about 275 hours, deposited according to embodiments disclosed herein, and having a thickness of 500 Å, 1000 Å, and 2000 Å. Notably, the WVTR is stable for each HDP silicon nitride layer over the time periods measured.

It is also noted that the HDP and the CCP deposited silicon nitride layers have substantially similar transmittance and step coverage properties. Both the HDP and CCP films had a greater than 90% transmittance at a 400 nm wavelength and a greater that 0.85 step coverage factor on a 2.5 µm step height pattern. HDP silicon nitride will also allow for desirably thinner barrier layers in a thin film encapsulation (TFE) structure, for example, conventional CCP silicon nitride layers in a TFE structure typically have a thickness of between 0.5 µm and 1 µm or more than 1 µm.

As shown in FIGS. 4H-4I, the 2000 Å layer of HDP silicon nitride has significantly improved barrier properties when compared to the 5000 Å layer of CCP silicon nitride. This allows silicon nitride barrier layers in a thin film encapsulation structure deposited using a HDP to have a thickness of below about 5000 Å, such as between about 500 Å and about 5000 Å, such as between about 500 Å and about 3000 Å, such as between about 500 Å and 2000 Å or below about 2000 Å.

Table 1 (shown below) and FIGS. 5A-5F illustrate the effect biasing the substrate support can have on the properties of silicon nitride layers of Table 1 deposited using HDP-CVD processes. As seen in Table 1, biasing the substrate support enables the deposition of low stress and/or compressive stress silicon nitride layers while maintaining the improved barrier properties of HDP-CVD silicon nitride layers compared to CCP silicon nitride layers as seen in FIGS. 4A-4I. The process properties and resulting silicon nitride film properties described in Table 1 are for a microwave linear plasma source (LPS) high density plasma assisted CVD silicon nitride layer on a 500 mm by 730 mm substrate using SiH4 and NH3 precursors. The SiH4 precursor flowrate was 480 sccm and the NH3 precursor flowrate was 2700 sccm and the SiH4 precursor, the NH3, and the carrier gas, if used, were mixed prior to distribution into a chamber processing volume. No carrier gases were flowed for samples HD1 to HD14. Sample HD15 had an Ar carrier gas flowrate of 1350 sccm and sample HD16 had an N2 gas flowrate of 1350 sccm. The substrate was initially heated to a processing temperature of 90° C. for each sample HD1-HD16. The substrate temperature was monitored during deposition for samples HD3 to HD13, and it was observed that the substrate reached temperatures as high as 155° C., however, it is recognized that OLED devices will thermally degrade at process temperatures of more than about 100° C. and that the substrate temperature should be maintained at below about 100° C. during the manufacturing of thin film encapsulation (TFE) structures over a previously formed OLED device. The frequency of the LPS power was 2.45 GHz. Table 1 shows that the film stress of the HDP silicon nitride examples is responsive to changes in bias of the substrate support, where positive stress values indicate a tensile stress and negative stress values indicate a compressive stress.

TABLE 1

| Example Ref. | LPS | Substrate Support Bias | | | Deposition | | | | | | Wet Etch | Substrate |
|---|---|---|---|---|---|---|---|---|---|---|---|---|
| Name | Power | Freq. | set | refl | Load | Thickness | Rate | Refractive | Stress | Si—H | N—H | Rate | Temp. |
| Units | W | KHz | W | W | W | A/min | A/min | Index | MPa | % | % | A/min | ° C. |
| HD1 | 2000 | | | | | 4467 | 1489 | 1.921 | 131 | 9.6 | 12.1 | 1249 | |
| HD2 | 3000 | | | | | 4501 | 1500 | 1.927 | 320 | 5.0 | 11.6 | 441 | |
| HD3 | 3000 | 373 | 4000 | 2500 | 1500 | 4795 | 1598 | 1.923 | −218 | 4.3 | 16.1 | 383 | 150 |
| HD4 | 3000 | 373 | 3000 | 1700 | 1300 | 4675 | 1558 | 1.928 | −170 | 4.5 | 16.2 | 358 | 144 |
| HD5 | 3000 | 373 | 2000 | 1300 | 700 | 4781 | 1594 | 1.921 | 43 | 4.9 | 15.3 | 408 | 150 |
| HD6 | 3000 | 373 | 2500 | 1500 | 1000 | 4785 | 1595 | 1.920 | −22 | 4.4 | 15.9 | 397 | 155 |
| HD7 | 2500 | 373 | 2500 | 1630 | 870 | 4659 | 1553 | 1.925 | −200 | 6.4 | 14.9 | 542 | 135 |
| HD8 | 2000 | 373 | 2500 | 1790 | 710 | 4643 | 1548 | 1.915 | −230 | 8.1 | 14.6 | 882 | 130 |
| HD9 | 3000 | 373 | 1500 | 985 | 515 | 4544 | 1515 | 1.922 | 25 | 4.9 | 15.3 | 449 | 135 |
| HD10 | 2500 | 373 | 2000 | 1454 | 546 | 4510 | 1503 | 1.921 | −145 | 6.5 | 14.8 | 572 | 133 |
| HD11 | 2500 | 373 | 1500 | 1060 | 440 | 4605 | 1535 | 1.919 | −44 | 6.2 | 14.3 | 567 | 137 |
| HD12 | 2000 | 373 | 2000 | 1420 | 580 | 4528 | 1509 | 1.914 | −170 | 7.7 | 13.6 | 876 | 130 |
| HD13 | 2000 | 373 | 1500 | 1140 | 360 | 4558 | 1519 | 1.912 | −137 | 7.9 | 13.9 | 1002 | 128 |
| HD14 | 2000 | 415 | 4000 | 2500 | 1500 | 4641 | 1547 | 1.915 | −343 | 7.4 | 14.8 | 865 | |
| HD15 | 2000 | 415 | 4000 | 2000 | 2000 | 4639 | 1546 | 1.920 | −297 | 6.3 | 13.7 | 574 | |
| HD16 | 2000 | 415 | 4000 | 1700 | 2300 | 4407 | 1469 | 1.920 | −490 | 7.4 | 14.5 | 1005 | |

FIGS. 5A-5F show the effect of substrate bias power (Bias set power (W)) on barrier and other properties of silicon nitride layers deposited using a microwave linear plasma source (LPS) high density plasma CVD method according to the embodiments described herein. FIGS. 5A-5F show silicon nitride layers deposited using an LPS RF power of 2000 W (described as 2000 W MW in FIGS. 5A-5F), 2500 W (2500 W MW), and 3000 W (3000 W MW) where the RF power has a frequency of 2.45 GHz. Silicon nitride layers using the 2000 W, 3000 W, and 5000 W processes were deposited on a 500 mm by 730 mm substrate with the substrate support biased at powers between 0 W and 4000 W using a 373 KHz frequency RF power source. As can be seen in FIGS. 5A-5F, silicon nitride layer properties of deposition rates (DR), refractive indexes (RI), and Si—H concentrations (Si—H %) remained substantially unchanged as the substrate bias power was increased from 0 W to 4000 W while N—H concentrations (N—H %) saw small increases and the wet etch rates (WER) saw small decreases with increasing substrate bias power. Notably, the film stress (Stress) of the HDP deposited silicon nitride layers was tunable based on the substrate support bias power, by moving from highly tensile stresses in the range of 100 MPa (tensile) to 320 MPa (tensile) with no bias power to 150 MPa (compressive) to 250 MPa (compressive) when 2500 W to 4000 W were applied to the substrate support. Overall, FIGS. 4A-4I illustrate how effective silicon nitride barrier layers can be formed using HDP-CVD relative to silicon nitride barrier layers formed using CCP-CVD, and FIGS. 5A-5F illustrate how desirable stress levels can be obtained for barrier layers formed using CCP-CVD or HDP-CVD by varying the bias applied to the substrate support.

Thus, the data from FIGS. 4A-4I and 5A-5F can be used to form an improved encapsulant. For example, the one or more barrier layers formed from the high-density plasma can be used to form barrier layers with improved oxygen-blocking and moisture-blocking properties relative to barrier layers formed from lower-density plasmas having the same thickness. Moreover, the one or more barrier layers formed from the lower-density plasma can help reduce a stress mismatch between the barrier layers and the buffer layer in between the barrier layers. This reduced stress mismatch can help prevent the encapsulant from cracking when the OLED device is subject to external stresses, such as bending. Thus, an encapsulant that includes one or more barrier layers formed from high-density plasmas and one or more barrier layers formed from lower-density plasmas can produce an encapsulant with improved oxygen-blocking and moisture-blocking properties and improved durability in response to external stresses relative to an encapsulant including barrier layers formed only from a high-density plasma or a lower-density plasma.

While the foregoing is directed to embodiments of the present disclosure, other and further embodiments of the disclosure may be devised without departing from the basic scope thereof, and the scope thereof is determined by the claims that follow.

The invention claimed is:

1. An organic light emitting diode (OLED) device, wherein an encapsulation structure is disposed over an OLED by a process comprising:
    depositing a first barrier layer comprising at least one of silicon nitride (SiN), silicon oxynitride (SiON), or silicon dioxide ($SiO_2$) over the OLED;
    depositing a buffer layer over the first barrier layer; and
    depositing a second barrier layer comprising at least one of SiN, SiON, or $SiO_2$ over the buffer layer, wherein at least one of the first barrier layer or the second barrier layer is deposited via a high-density plasma (HDP) assisted chemical vapor deposition (CVD) process and at least one of the first barrier layer or the second barrier layer is deposited via a capacitively coupled plasma (CCP) assisted CVD process.

2. The OLED device of claim 1, wherein the first barrier layer is deposited over the OLED via the HDP assisted CVD process and the second barrier layer is deposited over the buffer layer via the CCP assisted CVD process.

3. The OLED device of claim 2, wherein the first barrier layer deposited via the HDP assisted CVD process has a lower water vapor transmission rate (WVTR) relative to the second barrier layer deposited via the CCP assisted CVD process.

4. The OLED device of claim 1, wherein the first barrier layer is deposited over the OLED via the CCP assisted CVD process and the second barrier layer is deposited over the buffer layer via the HDP assisted CVD process.

5. The OLED device of claim 1, wherein the first barrier layer further comprises:
    a first portion deposited via the HDP assisted CVD process; and
    a second portion deposited over the first portion via the CCP assisted CVD process.

6. The OLED device of claim 1, wherein the first barrier layer, the buffer layer, and the second barrier layer have a total thickness from about 5000 angstroms to about 25000 angstroms.

7. An organic light emitting diode (OLED) device, wherein an encapsulation structure is disposed over an OLED by a process comprising:
    depositing a first barrier layer comprising at least one of silicon nitride (SiN), silicon oxynitride (SiON), or silicon dioxide ($SiO_2$) over the OLED via at least one of a high-density plasma (HDP) assisted chemical vapor deposition (CVD) process or a capacitively coupled plasma (CCP) assisted CVD process;
    depositing a buffer layer over the first barrier layer; and
    depositing a second barrier layer comprising at least one of SiN, SiON, or $SiO_2$ over the buffer layer via at least one of the HDP assisted CVD process or the CCP assisted CVD process, wherein at least one of the first barrier layer or the second barrier layer is deposited via the HDP assisted CVD process and at least one of the first barrier layer or the second barrier layer is deposited via the CCP assisted CVD process.

8. The OLED device of claim 7, wherein:
    the first barrier layer is a first SiN layer and the second barrier layer is a second SiN layer;
    one of the first SiN layer or the second SiN layer is deposited via the HDP assisted CVD process and one of the first SiN layer or the second SiN layer is deposited via the CCP assisted CVD process; and
    the one of the first SiN layer or the second SiN layer deposited via the HDP assisted CVD process has a lower percent change in a concentration of Si—O bonds than the one of the first SiN layer or the second SiN layer deposited via the CCP assisted CVD process.

9. The OLED device of claim 7, wherein:
    the first barrier layer is a first SiN layer and the second barrier layer is a second SiN layer;
    at least one of the first SiN layer or the second SiN layer is deposited via the CCP assisted CVD process and at least one of the first SiN layer or the second SiN layer is deposited via the HDP assisted CVD process; and
    the at least one of the first SiN layer or the second SiN layer deposited via the HDP assisted CVD process has a lower percent change in a concentration of Si—N bonds than the at least one of the first SiN layer or the second SiN layer deposited via the CCP assisted CVD process.

10. The OLED device of claim 7, wherein the at least one of the first barrier layer or the second barrier layer that is deposited via the HDP assisted CVD process is between about 1000 angstroms and about 2000 angstroms thick.

11. The OLED device of claim 7, wherein:
    the first barrier layer is a first SiN layer and the second barrier layer is a second SiN layer;
    at least one of the first SiN layer or the second SiN layer is deposited via the CCP assisted CVD process and at least one of the first SiN layer or the second SiN layer is deposited via the HDP assisted CVD process; and
    the at least one of the first SiN layer or the second SiN layer deposited via the HDP assisted CVD process has a lower percent change in a concentration of Si—H bonds than the at least one of the first SiN layer or the second SiN layer deposited via the CCP assisted CVD process.

12. A method of encapsulating an organic light emitting diode (OLED) device, comprising:
    depositing a first barrier layer comprising at least one of silicon nitride (SiN), silicon oxynitride (SiON), or silicon dioxide ($SiO_2$) over the OLED device via at least one of a high-density plasma (HDP) assisted chemical vapor deposition (CVD) process or a capacitively coupled plasma (CCP) assisted CVD process;
depositing a buffer layer over the first barrier layer; and
depositing a second barrier layer comprising at least one of SiN, SiON, or $SiO_2$ over the buffer layer via at least one of the HDP assisted CVD process or the CCP assisted CVD process, wherein at least one of the first barrier layer or the second barrier layer is deposited via the HDP assisted CVD process and at least one of the first barrier layer or the second barrier layer is deposited via the CCP assisted CVD process.

13. The method of claim 12, wherein the HDP assisted CVD process comprises generating a HDP via a HDP source selected from the group consisting of a linear microwave plasma source (LPS), an electron cyclotron resonance (ECR) plasma source, and an inductively coupled plasma (ICP) source.

14. The method of claim 12, wherein the HDP in the HDP assisted CVD process has an electron density of at least $10^{11}$ electrons/$cm^3$.

15. The method of claim 12, wherein the second barrier layer is deposited via the CCP assisted CVD process, and the plasma in the HDP assisted CVD process has an electron density that is greater than the electron density of the plasma in the CCP assisted CVD process.

16. The method of claim 12, wherein the at least one of the first barrier layer or the second barrier layer that is deposited via the HDP assisted CVD process is between about 1000 angstroms and about 2000 angstroms thick.

17. The method of claim 12, wherein the first barrier layer, the buffer layer, and the second barrier layer have a total thickness of about 5000 angstroms to about 25000 angstroms.

18. The method of claim 12, wherein:
the first barrier layer is a first SiN layer and the second barrier layer is a second SiN layer;
at least one of the first SiN layer or the second SiN layer is deposited via the CCP assisted CVD process and at least one of the first SiN layer or the second SiN layer is deposited via the HDP assisted CVD process; and
the at least one of the first SiN layer or the second SiN layer deposited via the HDP assisted CVD process has a lower percent change in a concentration of Si—O bonds than the at least one of the first SiN layer or the second SiN layer deposited via the CCP assisted CVD process.

19. The method of claim 12, wherein:
the first barrier layer is a first SiN layer and the second barrier layer is a second SiN layer;
at least one of the first SiN layer or the second SiN layer is deposited via the CCP assisted CVD process and at least one of the first SiN layer or the second SiN layer is deposited via the HDP assisted CVD process; and
the at least one of the first SiN layer or the second SiN layer deposited via the HDP assisted CVD process has a lower percent change in a concentration of Si—N bonds than the at least one of the first SiN layer or the second SiN layer deposited via the CCP assisted CVD process.

20. The method of claim 12, wherein:
the first barrier layer is a first SiN layer and the second barrier layer is a second SiN layer;
at least one of the first SiN layer or the second SiN layer is deposited via the CCP assisted CVD process and at least one of the first SiN layer or the second SiN layer is deposited via the HDP assisted CVD process; and
the at least one of the first SiN layer or the second SiN layer deposited via the HDP assisted CVD process has a lower percent change in a concentration of Si—H bonds than the at least one of the first SiN layer or the second SiN layer deposited via the CCP assisted CVD process.

* * * * *